(12) United States Patent
Fujisawa et al.

(10) Patent No.: US 6,667,139 B2
(45) Date of Patent: Dec. 23, 2003

(54) METHOD OF MANUFACTURING SEMICONDUCTOR DEVICE

(75) Inventors: Tadahito Fujisawa, Tokyo (JP); Masafumi Asano, Yokohama (JP); Kyoko Izuha, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/107,246

(22) Filed: Mar. 28, 2002

(65) Prior Publication Data

US 2002/0182521 A1 Dec. 5, 2002

(30) Foreign Application Priority Data

Mar. 29, 2001 (JP) ........................................ 2001-097115

(51) Int. Cl.⁷ .............................. G03F 9/00; G03C 5/00
(52) U.S. Cl. .......................................... 430/30; 430/311
(58) Field of Search ..................... 430/30, 311

(56) References Cited

U.S. PATENT DOCUMENTS

| | | | |
|---|---|---|---|
| 5,508,803 A | 4/1996 | Hibbs et al. | 356/243 |
| 5,770,338 A | 6/1998 | Lim et al. | 430/22 |
| 6,226,074 B1 | 5/2001 | Fujisawa et al. | 355/53 |
| 6,376,139 B1 * | 4/2002 | Fujisawa et al. | 430/30 |
| 6,440,616 B1 * | 8/2002 | Izuha et al. | 430/5 |

FOREIGN PATENT DOCUMENTS

| | | |
|---|---|---|
| JP | 8-45804 | 2/1996 |
| JP | 9-329889 | 12/1997 |
| JP | 10-256114 | 9/1998 |
| JP | 10-275755 | 10/1998 |
| JP | 11-307431 | 11/1999 |
| JP | 2000-12425 | 1/2000 |
| JP | 2000-292906 | 10/2000 |

OTHER PUBLICATIONS

Starikov, A., "Exposure Monitor Structure", SPIE vol. 1261 Integrated Circuit Metrology, Inspection, and Process Control IV (1990), pp. 315–324.

Sturtevant, J. et al., "Use of scatterometric latent image detector in closed loop feedback control of linewidth", SPIE vol. 2196 (1994), pp. 352–359.

Wheeler, D., "Phase Shift Focus Monitor Applications to Lithography Tool Control", SPIE vol. 3051 (1997), pp. 225–233.

* cited by examiner

Primary Examiner—Christopher G. Young
(74) Attorney, Agent, or Firm—Finnegan, Henderson, Farabow, Garrett & Dunner, L.L.P.

(57) ABSTRACT

A pattern is formed on a resist film by applying the coating f a resist film, first heat treatment, first cooling treatment, the exposure treatment, second heat treatment, second cooling treatment, and development. After the exposure treatment, at least one of the effective exposure and the focus position in the exposure treatment applied to the resist film is obtained. Then, at least one of the difference between the optimum exposure in performing the exposure by using the mask and a set value and the difference between a optimum focus position and the a value is calculated from at least one of the effective exposure obtained and the focus position obtained. Further, at least one of the exposure condition and the process condition after the exposure is calculated in accordance with the calculated difference.

20 Claims, 26 Drawing Sheets

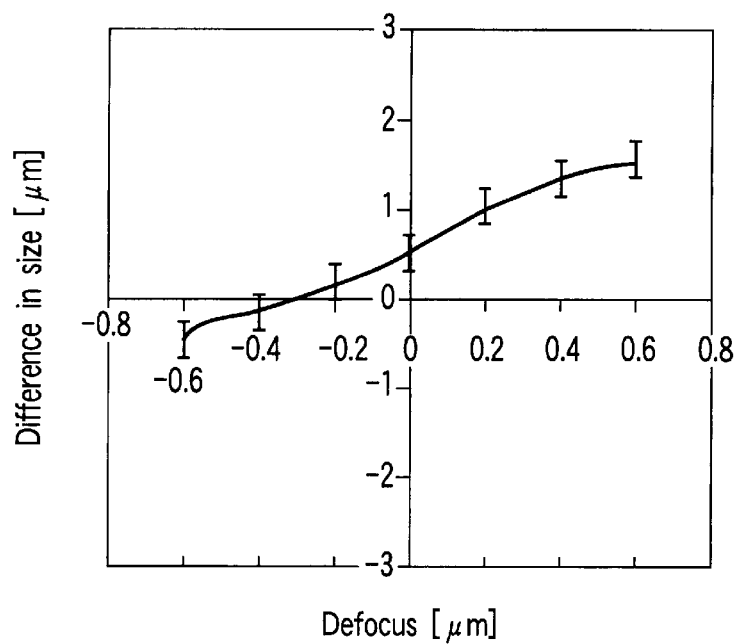
F I G. 18
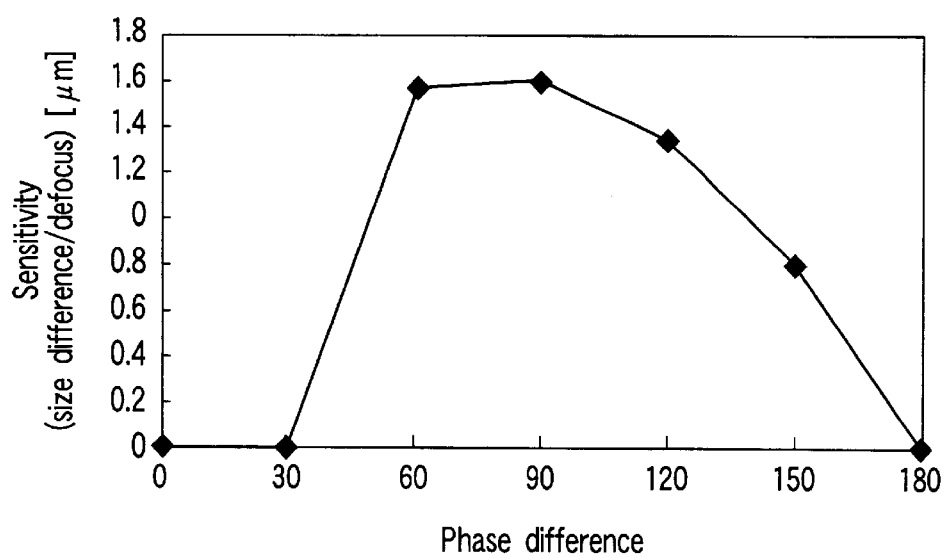
F I G. 19

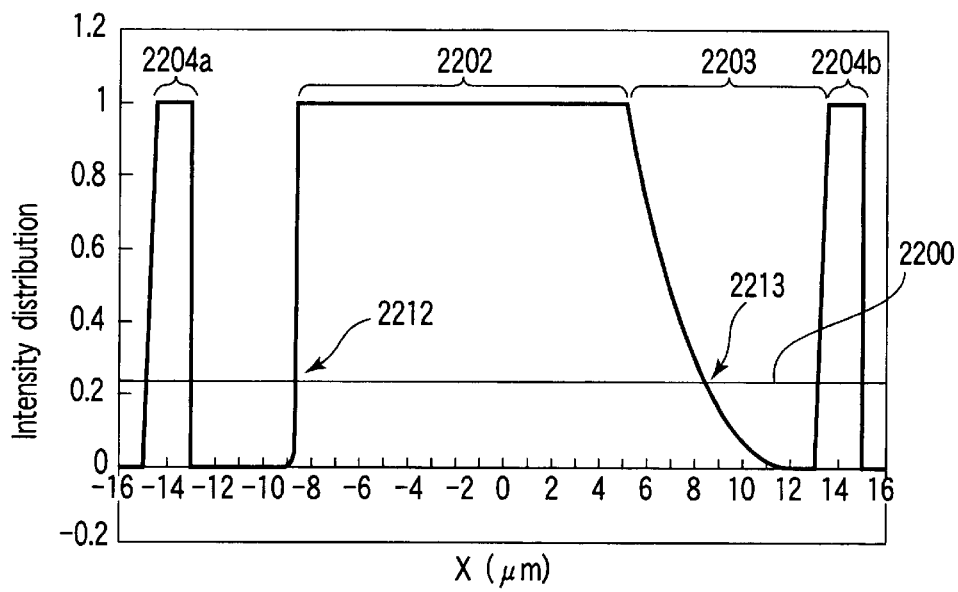
F I G. 22
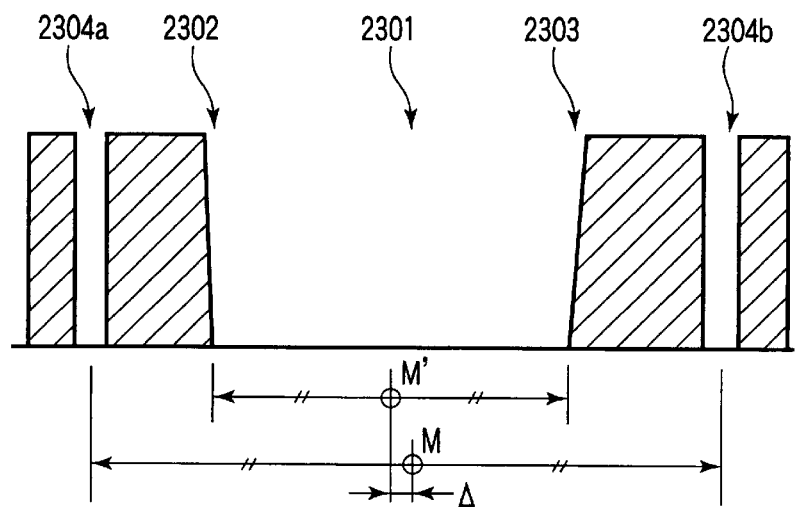
F I G. 23

$y = 0.0098x - 0.0003$
y: Relative positional deviation amount
x: Appropriate change of exposure

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2001-097115, filed Mar. 29, 2001, the entire contents of which are incorporated herein by reference.

BACKGROUND OF THE INVENTION

1. Field of the Invention

The present invention relates to a method of manufacturing a semiconductor device comprising setting the exposure amount and the focus value in forming a pattern by transferring a circuit pattern on a mask onto a resist film.

2. Description of the Related Art

In the photolithography process in manufacturing a semiconductor integrated circuit, an apparatus called an exposure apparatus for performing pattern exposure is used. An example of the exposure apparatus is a reduction projection exposure apparatus (stepper or scanner). In this reduction projection exposure apparatus, light from the light source is transmitted through a mask on which an exposure pattern is drawn so that the pattern is reduced by the optical system and projected onto a wafer.

In pattern formation for transferring a pattern drawn on the mask onto the wafer, the minimum transferable pattern size must be reduced. On the basis of the optical imaging theory, letting NA be the numerical aperture of the projection optical system, and λ be the exposure wavelength, a resolution (line width) R and depth of focus DOF are given by well-known equations:

$$R = k1 \frac{\lambda}{NA} \quad (1)$$

$$DOF = k2 \frac{\lambda}{NA^2} \quad (2)$$

where k1 and k2 are process coefficients.

These are called Rayleigh equations and used as criteria to evaluate the imaging performance of a projection exposure apparatus. In response to the demand for shrinkage in feature size of patterns, the exposure wavelength is shortened, the numerical aperture of a projecting lens is increased, and simultaneously, the process is improved. However, since the recent demand for shrinkage in feature size of device patterns is stricter, a sufficient process margin for the exposure margin or depth of focus can hardly be obtained, resulting in a decrease in yield.

For photolithography with a small process margin, great importance is being attached to error distribution (error budget) and accurate analysis of error that consumes the process margin. For example, even when a wafer is exposed at the supposedly same set exposure to form a number of chips, the effective appropriate exposure varies due to PEB (Post Exposure Bake), nonuniformity of development in the wafer surface, or a variation in resist film thickness in the wafer surface, resulting in a decrease in yield. Hence, demand has arisen for an exposure and focus control method that effectively uses a small process margin, accurately monitors and feeds back or forward the exposure and focus position to prevent a decrease in yield. At the same time, error factors that consume the process margin must be accurately analyzed in units of process units, and major error factors must be removed on the basis of the analysis result.

Two methods have been reported as exposure control methods. As the first method, the exposure is obtained on the basis of the measurement result of a resist pattern line width or latent image pattern line width. As the second method, the effective exposure is obtained on the basis of measurement data of diffraction light intensity that is obtained by irradiating a resist pattern line width or latent image pattern line width with collimated light.

However, the pattern line width changes depending on not only the exposure but also the focus position. For this reason, it cannot be determined from the measurement result obtained by the above normal methods whether the line width is affected by a variation in exposure value or focus position, or both of them.

On the other hand, two methods have been reported as focus monitor methods. As the first method, the focus position is measured using a variation in size of a monitor mark after exposure due to defocus. As the second method, a variation in focus position is measured as a position shift of a pattern using a mark of phase shift mask type.

In the conventional focus monitor methods, even when the focus shift amount can be obtained and feedback to the focus set value, a variation in appropriate exposure value cannot be taken into consideration only using these marks. Hence, the exposure margin cannot be effectively used while suppressing the process variation factors.

The above problems become more serious for finer patterns with a smaller focus margin, or isolated patterns having a smaller feature size. The process variation factors cannot be completely suppressed only by monitoring one of the exposure and focus position, and feedback the obtained measurement result to the set exposure, PEB temperature, development time, and the like of the exposure apparatus.

BRIEF SUMMARY OF THE INVENTION

According to one embodiment of the present invention, there is provided a method of manufacturing a semiconductor device involving a method of controlling an apparatus for manufacturing a semiconductor device, the method comprising setting the exposure and the focus position in forming a pattern by transferring a circuit pattern formed on a mask by an exposure apparatus onto a resist film formed on a wafer, comprising:

coating the wafer with a resist film; applying a first heat treatment to the resist film; applying a first cooling treatment to the resist film subjected to the first heat treatment; the heating condition for the second heat treatment, setting an exposure and a focus position at prescribed values and applying an exposure treatment to the resist film to which is applied a first cooling treatment by using a mask in which is arranged a monitor mark including at least one of an exposure monitor mark for detecting the effective exposure on the wafer and a focus monitor mark for detecting the effective focus on the wafer so as to form a latent image corresponding to the monitor mark in the resist film; applying a second heat treatment to the resist film having the latent image formed therein; applying a second cooling treatment to the resist film having the second heat treatment applied thereto; applying a developing treatment to the resist film having the second cooling treatment applied thereto so as to form a monitor pattern corresponding to the latent image; measuring the state of the latent image of the monitor mark or the state of the monitor pattern at least once any time after the exposure treatment, after the second heat treatment, during the second cooling treatment, after the second cooling treatment, during the developing treatment, and after the developing treatment; obtaining at least one of the effective exposure and the focus position in the exposure treatment applied to the resist film based on the measured state of the latent image of the monitor mark or monitor pattern; calculating at least one of the difference between the optimum exposure in performing an exposure by using the mask and the set value and the difference between the optimum focus position and the set value from at least one of the obtained effective exposure and focus position; and changing at least one of the set value of the focus position, the set value of the exposure, the heating condition for the first heat treatment, the developing condition for the developing treatment, the residence time between the completion of the exposure treatment and the start-up of the second heat treatment, the residence time between the completion of the second heat treatment and the start-up of the second cooling treatment, the residence time between the completion of the second cooling treatment and the start-up of the developing treatment, the residence time between the completion of the resist film coating and the start-up of the heat treatment, the residence time between the completion of the first heat treatment and the start-up of the first cooling treatment, and the residence time between the completion of the first cooling treatment and the start-up of the exposure.

BRIEF DESCRIPTION OF THE SEVERAL VIEWS OF THE DRAWING

FIG. 18 is a graph of the correcting curve showing the relationship between the defocus amount and the difference in size between the resist patterns formed by using two kinds of marks selected from the focus monitor marks shown in FIGS. 16A and 16B;

FIG. 19 is a graph showing the relationship between the detection sensitivity of the focus and the difference in phase between the translucent film portion and the transmitting portion of the focus monitor mark shown in FIGS. 16A and 16B;

FIG. 22 is a graph showing the light intensity distribution on the resist corresponding to the A–A' portion of the exposure monitor mark shown in FIG. 20;

FIG. 23 is a cross sectional view showing the cross sectional shape of the A–A' portion of the resist pattern finally obtained by exposing and developing the exposure monitor mark shown in FIG. 20;

DETAILED DESCRIPTION OF THE INVENTION

First Embodiment

The first embodiment of the present invention is directed to an example effective for suppressing particularly the change in size of the pattern in a lot.

Figure 1:
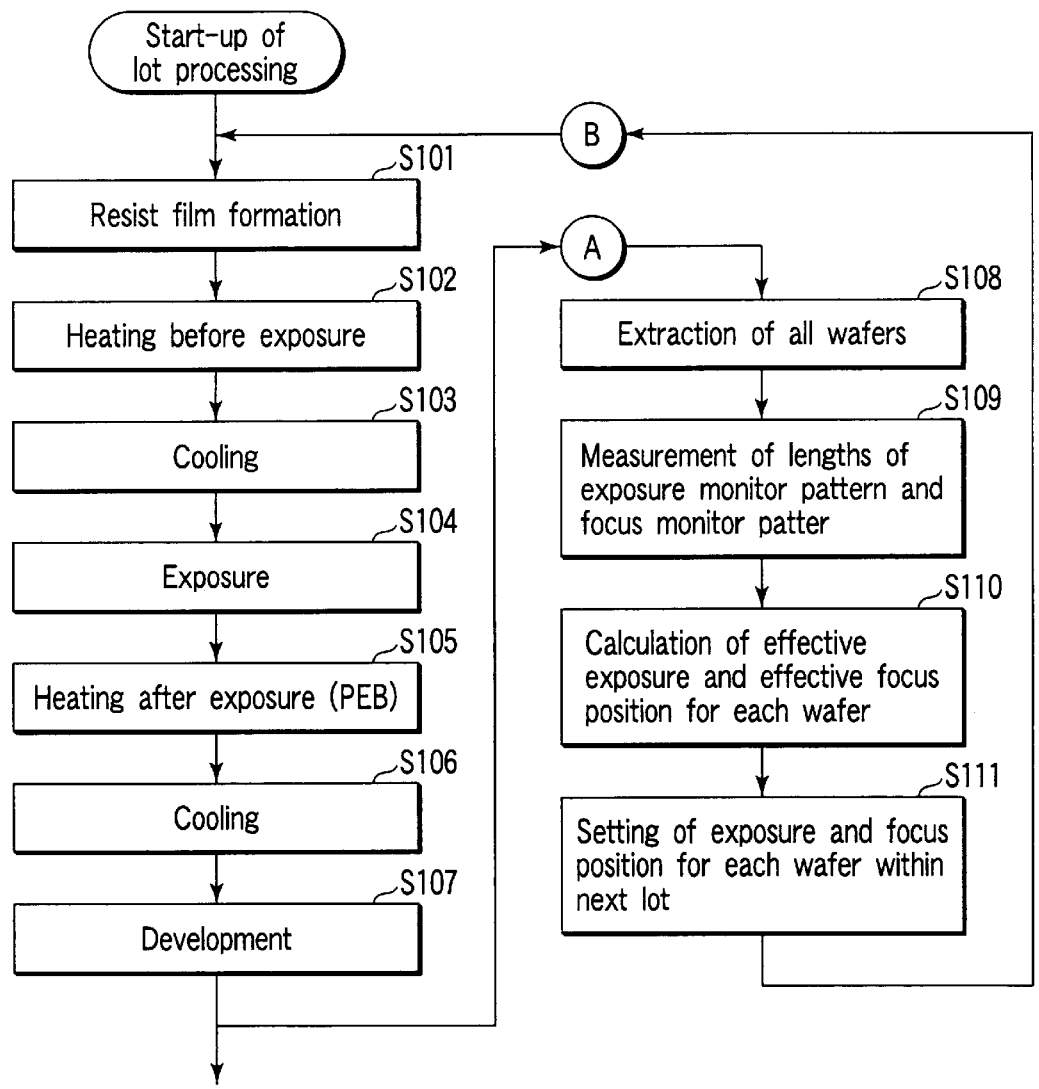
FIG. 1 is a flow chart showing a control method of a semiconductor manufacturing process according to a first embodiment of the present invention.
Figure 2:
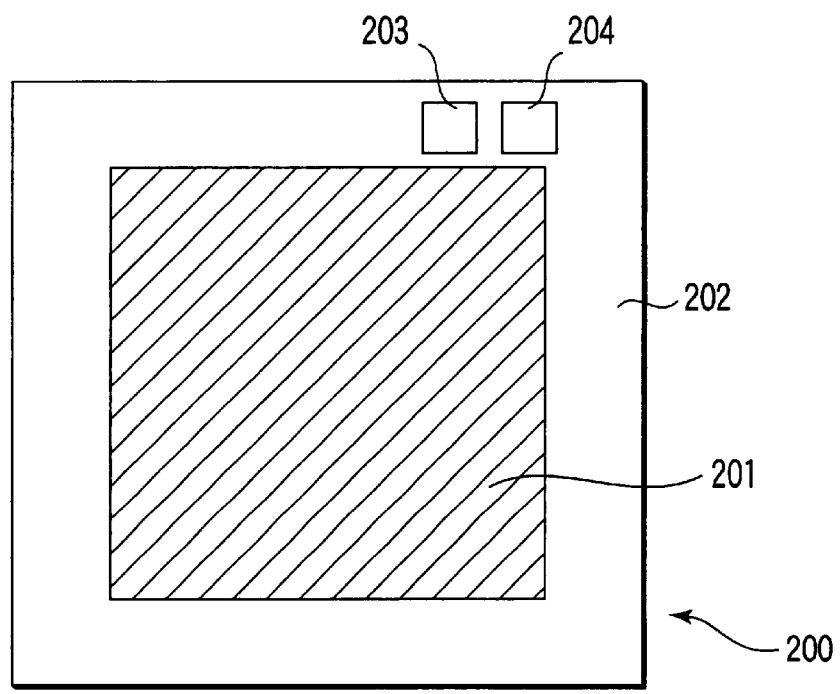
FIG. 2 is a plan view schematically showing the construction of a mask according to the first embodiment of the present invention.

FIG. 1 is a flow chart showing a method of controlling the manufacturing process of a semi-conductor device according to the first embodiment of the present invention, and FIG. 2 is a plan view showing the mask used in the manufacturing process of the semiconductor device.

As shown in FIG. 2, a mask 200 used for the exposure includes a dicing region 202 that does not include a device pattern 201. Arranged in the dicing region 202 are an exposure monitor mark 203 for monitoring the effective exposure and a focus mark 204.

The focus monitor mark 204 is a mark for forming a pattern on a resist film without relying on the exposure and relying solely on the focus position and, thus, is a mark for obtaining the focus position that is not dependent on the exposure.

On the other hand, the exposure monitor mark 203 is a mark for forming a pattern on the resist film without relying on the focus position and relying solely on the exposure.

In the first embodiment of the present invention, a pattern is formed on a resist film by applying the coating of a resist film (step S101), the heating prior to the exposure (step S102), the exposure (step S103), the heating after the exposure (step S105), the cooling (step S106) and the development (step S107) to the pilot lot (first wafer group) prior to introduction of the product lot (second wafer group). The process in steps S101 to S107 is equal to the conventional process and, thus, the detailed explanation thereof is omitted.

In the next step, wafers in an amount sufficient for monitoring the change in the effective exposure and the change of focus within the lot are extracted from the wafers having the resist pattern formed therein (step S108), followed by measuring the pattern obtained by exposing the both monitor marks (step S109). Obtained from the results of these steps are the effective exposure that is not dependent on the focus position of each wafer within the lot and the effective focus position that is not dependent on the exposure (step S110). Then, at least one of the effective exposure and the effective focus position thus obtained is feedback to the subsequent lots for performing the exposure (step S111).

First of all, described is the measurement of the exposure, which is not dependent on the focus position, using the exposure monitor mark.

Used was an exposure monitor mark formed in a mask of the type proposed in "*Exposure Monitor Structure* (Alexander Staikov, SPIE vol. 1261 p. 315–324)". The exposure monitor mark used is featured in that arranged is a pattern in which the ratio in size of the transmitting portion of the mask pattern to the light shielding portion (duty ratio) is continuously changed within a range of not being resolved in the projecting exposure apparatus used so as to make it possible to form a pattern having a tilt distribution in the exposure that is not dependent on the position of the focus on the wafer.

Figure 3:
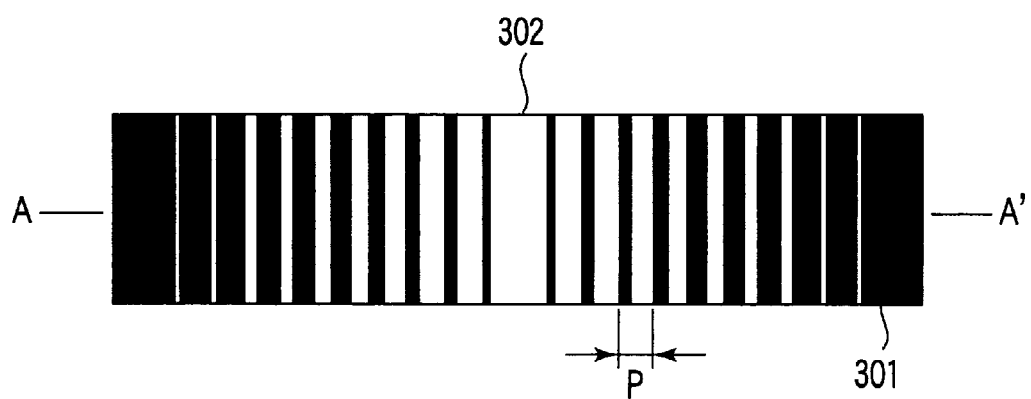
FIG. 3 is a plan view schematically showing the construction of an exposure monitor mark according to the first embodiment of the present invention.

FIG. 3 shows the exposure monitor mark of the type referred to above. In FIG. 3, a reference numeral 301 denotes a light-shielding portion, and a reference numeral 302 denotes a transmitting portion. The exposure monitor mark is formed such that the size of the light-shielding portion is increased from the central portion toward the peripheral portion with the pitch P set constant. The pitch P is a pitch that is not resolved under the exposure conditions employed.

The present inventor has set the pitch P of the exposure monitor mark at 0.19 $\mu$m in terms of the wafer size so as to satisfy the condition (3) given below, which does not permit the diffracted light (primary diffracted light et seq.) in the mask pattern to enter the pupil of the projecting lens and permits the straight-running light (zero order diffracted light) alone to enter the pupil of the projecting lens in view of the exposure conditions used that the exposure wavelength $\lambda$ is 248 nm, the number of apertures NA on the emitting side of the projecting optical system of the exposure apparatus is 0.68, the coherent factor $\sigma$ of the illuminating optical system of the exposure apparatus is 0.75, and used is a annular illumination having a shielding rate of $\frac{2}{3}$:

$$P/M \leq \lambda/(1+\sigma)NA \qquad (3)$$

where M represents the magnification of the mask.

Figure 4:
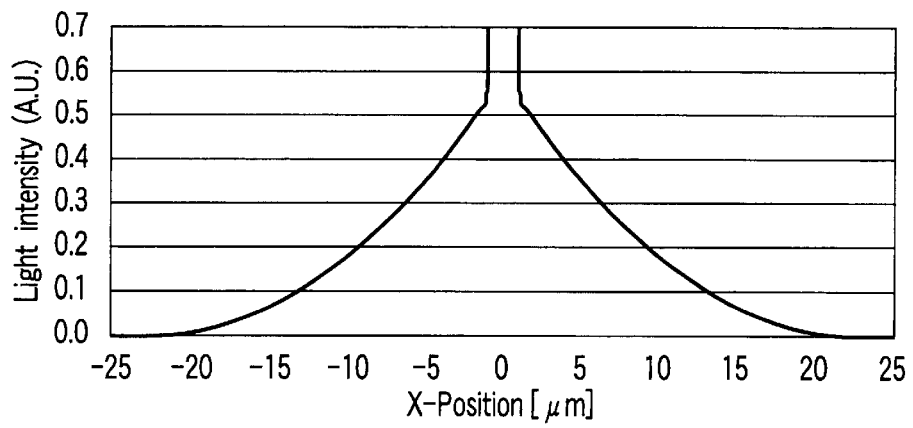
FIG. 4 is a graph showing an optical image intensity distribution obtained by transferring the exposure monitor mark shown in FIG. 3 onto a wafer.
Figure 5A:
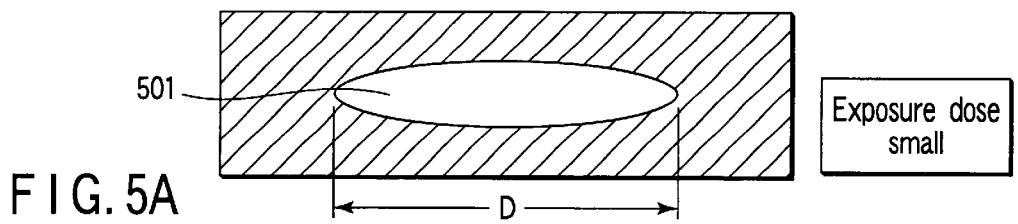
FIGS. 5A and 5B are plan views each showing the shape of the exposure monitor mark formed on a resist film by using the exposure monitor mark shown in FIG. 3.
Figure 5B:
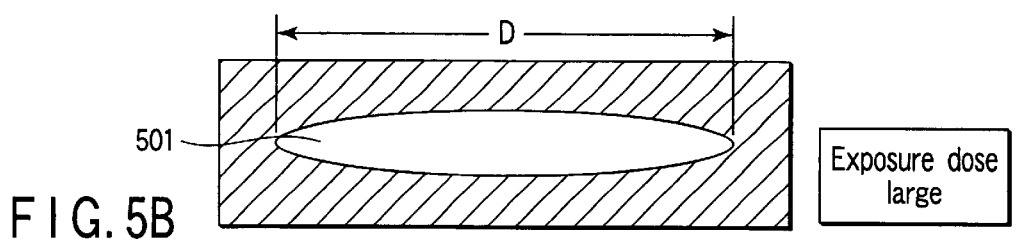

FIG. 4 shows the distribution of the optical image intensity corresponding to the A–A' portion on the wafer surface that is obtained when the exposure monitor mark shown in FIG. 3 is transferred onto a resist film. Since the wafer surface is irradiated with only the zero order diffraction light diffracted by the monitor mark, the distribution of the image intensity forms the distribution proportional to the square of the area of the transmitting portion. If an exposure is performed by using the mask while changing the set value of the exposure of the exposure apparatus, an exposure monitor pattern 501 is formed with the length D of the pattern 501 changed depending on the exposure, as shown in FIGS. 5A and 5B. FIG. 5A is a plan view showing the exposure monitor pattern formed on the resist film in the case where the exposure is small. On the other hand, FIG. 5B is a plan view showing the exposure monitor pattern formed on the resist film in the case where the exposure is large. It is possible to obtain a correcting curve used for obtaining an effective exposure that is not dependent on the focus position by measuring the length of the pattern formed on the resist film with an optical line width measuring apparatus.

In performing the exposure, a silicon wafer surface was coated with a chemical solution by a spin coating method, followed by applying a heat treatment to the coated chemical solution so as to form a coating type antireflection film having a thickness of 60 nm and subsequently forming a chemically amplified positive resist film having a thickness of 0.4 $\mu$m by a spin coating method. Then, the positive resist film was subjected to a pre-bake treatment at 100° C. for 90 seconds. A series of these treatments were performed within a track joined to an exposure apparatus for processing the product lot. The wafer after completion of these treatments was transferred into the exposure apparatus so as to perform the exposure and, thus, to transfer the exposure monitor mark referred to above. Further, a post-exposure bake, a cooling treatment and a developing treatment were successively conducted so as to form the exposure monitor pattern on the resist film.

For correcting the exposure monitor pattern, the exposure was performed by changing the value of the exposure within a range of ±20% of 15 mJ/cm$^2$, which is the set value of the exposure adapted for the device pattern in the case of using the resist film.

Figure 6:
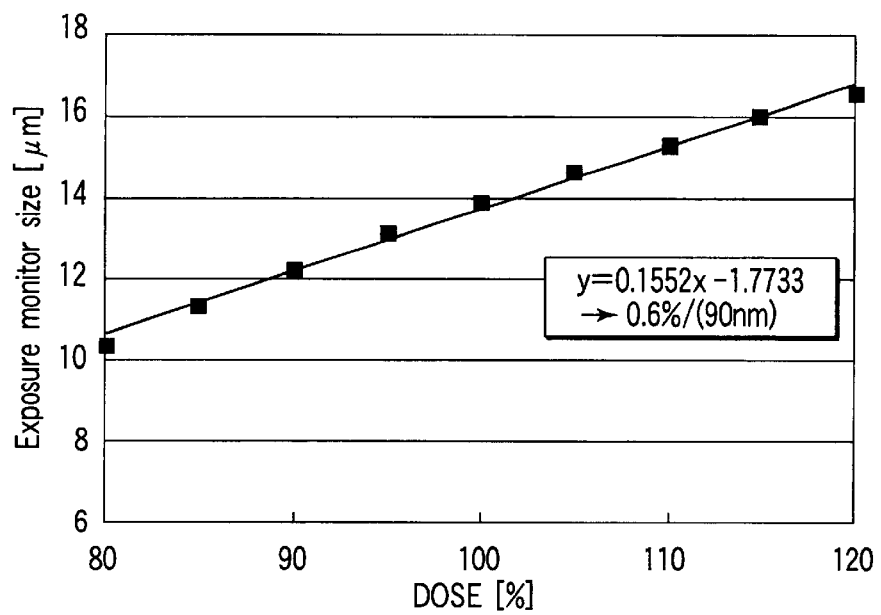
FIG. 6 is a graph showing a correcting curve for obtaining an exposure from the pattern length of the exposure monitor mark.

FIG. 6 shows the relationship between the measured length of the pattern obtained as a correcting curve and the set value of the exposure of the exposure apparatus. The reproducibility of the optical length measuring apparatus used for the measurement was evaluated, with the result that obtained was a reproducibility of 90 nm. This supports that the exposure monitor pattern is capable of detecting 0.6% of change in the exposure. It follows that it is possible to describe the effective exposure on the basis of the length D of the exposure monitor pattern 501. Incidentally, in FIG. 6, the set value of the exposure is set at 100% on the abscissa.

Then, the focus measurement, which is not dependent on the exposure, using the focus monitor mark and the exposure monitor mark will now be described.

Figure 7:
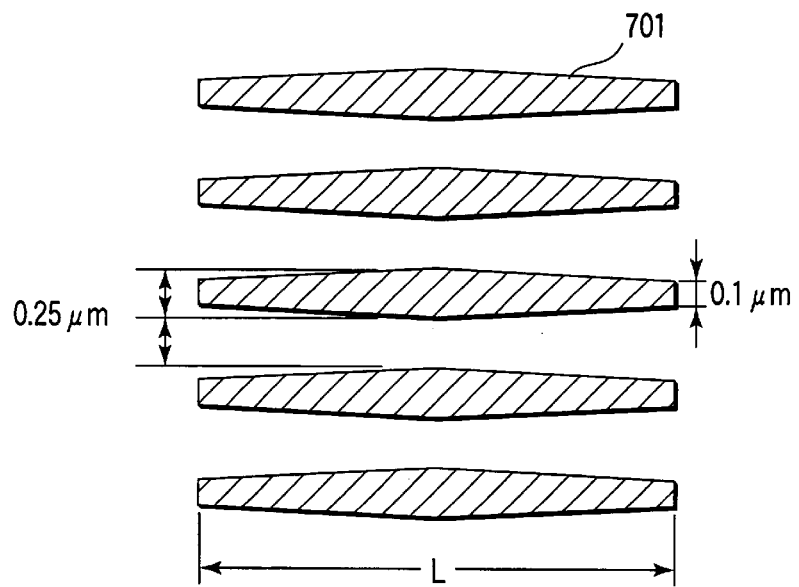
FIG. 7 is a plan view schematically showing the construction of a focus mark according to a first embodiment of the present invention.

Used was a focus monitor mark of the type that the focus position is measured by the change caused by the defocus in the size of the monitor pattern after the exposure. FIG. 7 shows the focus monitor mark formed in the mask, which was used for forming the focus monitor pattern used in this embodiment. The size shown in FIG. 7 is the size in terms of the wafer. A pattern 701 constituting the focus monitor mark has width of 0.25 $\mu$m in the central portion, and the width of the pattern 701 is gradually decreased from the central portion toward the periphery (tip portion) so as to be decreased to 0.1 $\mu$m at the tip of the pattern 701. Five patterns 701 are formed 0.25 $\mu$m apart from each other so as to form a focus monitor mark.

The present inventor has paid attentions to the situation that it is possible to obtain separately the exposure and the focus position as independent parameters by correcting in advance the behavior of the size W of the pattern length L after the transfer of the focus monitor pattern formed by using the focus monitor mark shown in FIG. 7 relative the effective exposure obtained from the measurement of the exposure monitor pattern noted above, i.e., the length D of the exposure monitor pattern in this case.

In preparing the correcting curve of the focus, exposure was performed in advance by changing the set exposure of the exposure apparatus and the focus position. Concerning the exposure, the result of the measurement of the length of the pattern formed by using an exposure monitor mark that is not dependent on the focus position referred above was changed into the effective exposure. Finally, the relationship among the effective exposure, the defocus distance and the pattern length W was obtained for preparing the correcting curve of the focus.

Figure 8:
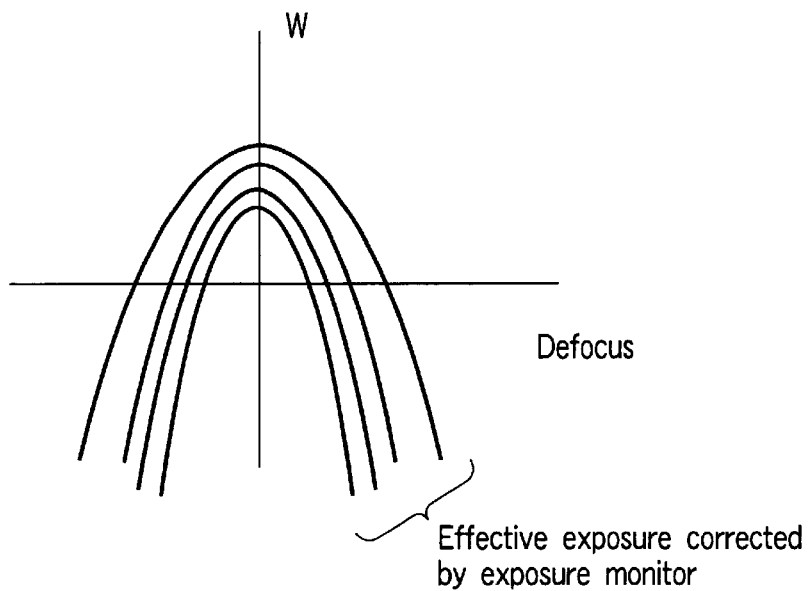
FIG. 8 is a graph showing the dependence of the pattern length W of the focus monitor mark on the focus value in the effective exposure corrected by the exposure-correcting curve.

FIG. 8 shows the dependence on the focus position of the length W of the pattern formed in the resist film by using the focus monitor mark (FIG. 7) in the effective exposure corrected by the exposure-correcting curve shown in FIG. 6.

Incidentally, in obtaining the correcting curve noted above, the optimum exposure satisfying both the desired focus allowance and the desired exposure allowance was 15 mJ/cm$^2$, the effective exposure in this case was 13.747 $\mu$m in terms of the length D of the exposure monitor pattern. And the offset of the focus position was 0 $\mu$m.

The exposure procedure will now be described with reference FIG. 1.

Steps S101 to S107

The wafers in a single lot (pilot lot) are put under the process conditions, and a resist pattern is formed through the coating of resist film (step S101), the heating before the exposure(first heat treatment) (step S102), the cooling(first cooling treatment) (step S103), the exposure (step S104), the heating after the exposure(second heat treatment) (step S105), the cooling(second heat treatment) (step S106) and the development (step S107). Incidentally, a single lot consists of 24 wafers.

Steps S108 and S109

All the wafers after the development each having a resist pattern formed therein are extracted (step S108). Then, the length of the resist pattern formed by five shots of exposure monitor mark and the focus monitor mark is measured by using an optical length measuring apparatus in respect of each of 24 wafers included in a single lot (step S109).

Step S110

Figure 9:
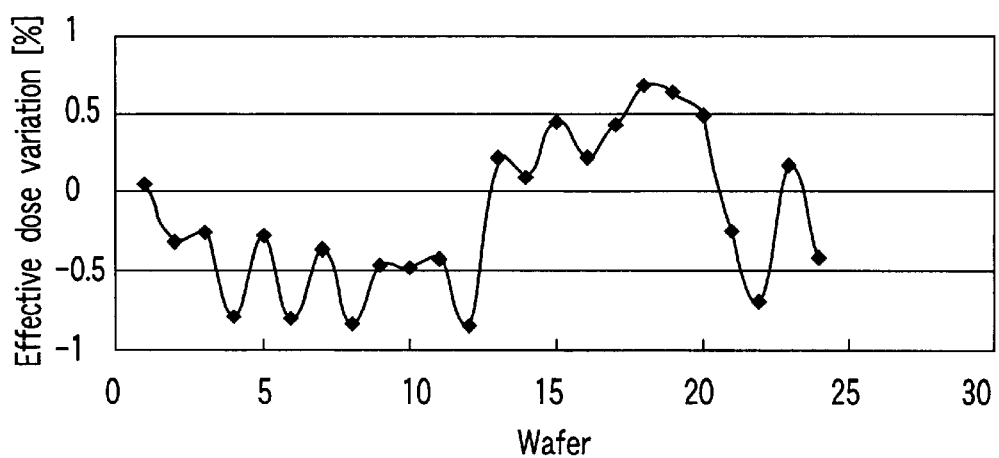
FIG. 9 is graph showing the distribution of changes in the effective exposure in a single lot.
Figure 10:
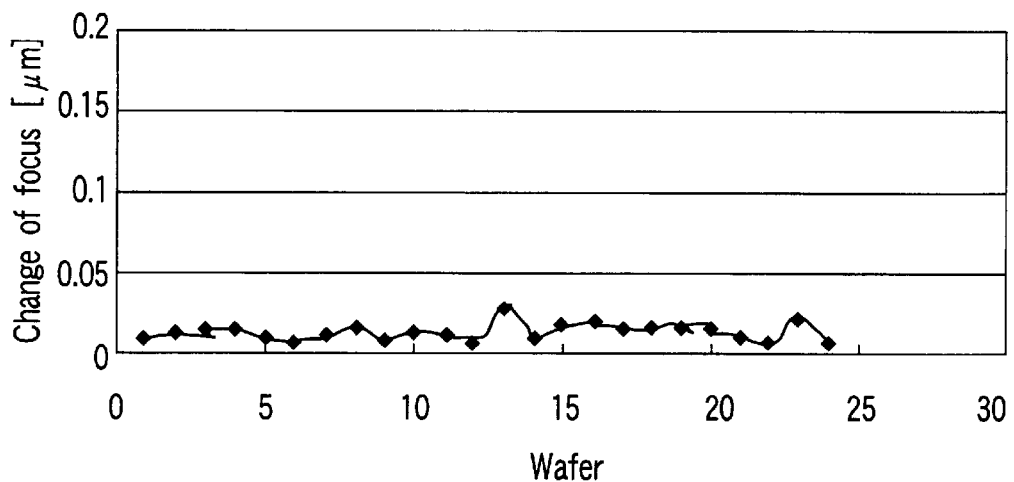
FIG. 10 is graph showing the distribution of changes in the effective focus value in a single lot.

The effective exposure D$\epsilon$ (i) (i=1 to 24) and the focus position F$\epsilon$ (i) (i=1 to 24) for each of the wafers included in the single lot are calculated on the basis of the measurement performed in step S109. FIG. 9 shows the distribution of the change in the effective exposure in the single lot, and FIG. 10 shows the distribution of the change in the focus position within the single lot.

The changes in the exposure and the focus position within the single lot are generated for each wafer by the influences given by the differences among the different process units in the waiting time and in the atmosphere within the process unit, the error in the exposure and the error in the focus. The present inventor has paid attentions to the state that, in the case of a lot treatment of a relatively small scale, particularly, in the case of a single lot treatment in which a single lot unit constitutes the scale of the lot handled in a single process, the process unit conditions for the wafers in the lot are systematically aligned. In other words, in the wafer in the same slot position within the lot, the conditions of the process unit such as the waiting time exhibit the relatively similar tendency in any lot.

Step S111

Where the wafer flows within the same lot, the exposure for each wafer within the single lot is determined in view of the distribution in the change of the exposure and the distribution in the change of the focus within the lot, which are obtained in step S110 referred to above.

Incidentally, the exposure D(i) and the focus position F(i) of the wafer to which is applied the exposure in the i-th order relative to the set exposure $D_0$ and the focus position $F_0$ are set as follows:

$$Di=D_0+D_{(i)}=D_0+(D_0-D_{\epsilon(i)})$$

$$Fi=F_0+F_{(i)}=F_0+(F_0-F_{\epsilon(i)})$$

Incidentally, the amount of change in the focus position was small this time, as shown in FIG. 10 and, thus, no particular modification was added to the focus. As a result, the distribution in the change of the exposure shown in FIG. 11 was obtained in the next lot (product lot) so as to suppress the change in the exposure within the lot that was observed in the preceding lot and, thus, it was possible to the effective exposure uniformly in the lot.

Incidentally, in the example described above, the amount of deviation of the focus was negligibly small and, thus, no modification was added. Where the amount of deviation is large, the direction of the deviation of the focus is unknown when it comes to a mark formed by using the focus monitor mark shown in FIG. 7. Therefore, it cannot be judged in which of the positive and negative directions the offset should be added to the focus position for performing the exposure. Such being the situation, in the focus monitor mark of the type shown in FIG. 7, the offset direction of the focus position is judged on the basis of the tendency in the deviation of the focus by utilizing, for example, the QC data obtained on the spot.

Therefore, the present inventor also arranged a focus monitor mark prepared by swinging by 90° the focus monitor mark shown in FIG. 7 so as to monitor the amount of deviation of the focus by utilizing the astigmatism difference of the exposure apparatus used. It was known in advance that there was a difference of 0.15 μm in the focus position between the pattern in the direction of 90° and the pattern in the direction of 0° in the exposure device used this time. It is possible to perform the monitoring in also the deviating direction of the focus position by utilizing the particular astigmatism difference.

Figure 12:
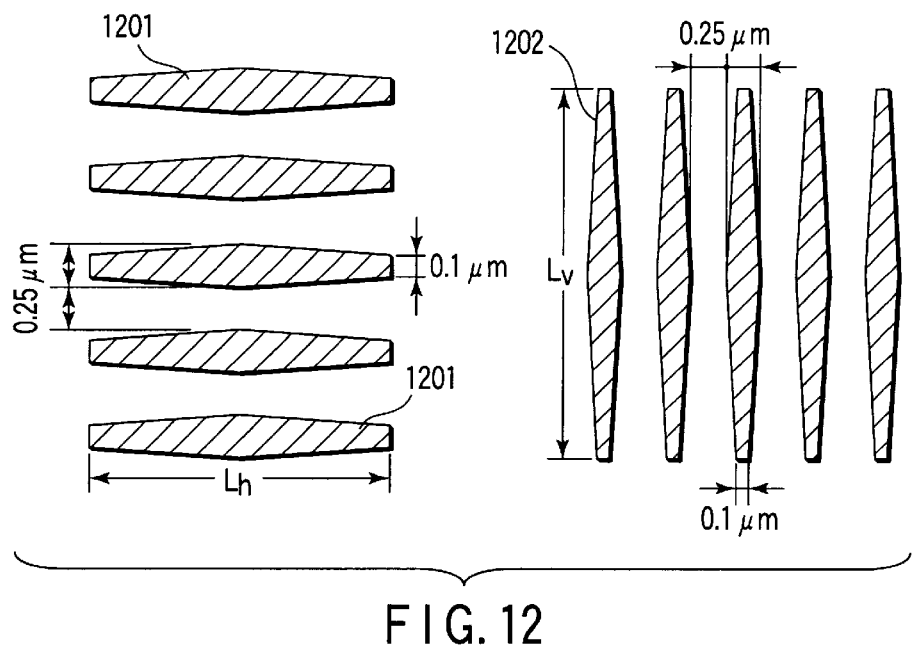
FIG. 12 is a drawing schematically showing the focus monitor mark that also permits judging the direction of deviation of the focus.

FIG. 12 shows a focus monitor mark of the type that also permits judging the deviating direction of the focus. As shown in FIG. 12, focus monitor marks 1201 and 1202 similar to the focus monitor mark shown in FIG. 7 are arranged in directions perpendicular to each other.

It is possible to obtain separately the exposure and the focus as independent parameters by correcting in advance the size Lv and the Lh portion of the focus monitor marks 1201 and 1202 shown in FIG. 12 and the behaviors of the pattern length Wv, Wh after the exposure and the development relative to the effective exposure obtained by the measurement of the exposure monitor pattern formed in the resist film by using the exposure monitor mask referred to above. The specific monitoring method of the deviation amount of the focus will now be described in more detail as follows.

Figure 13:
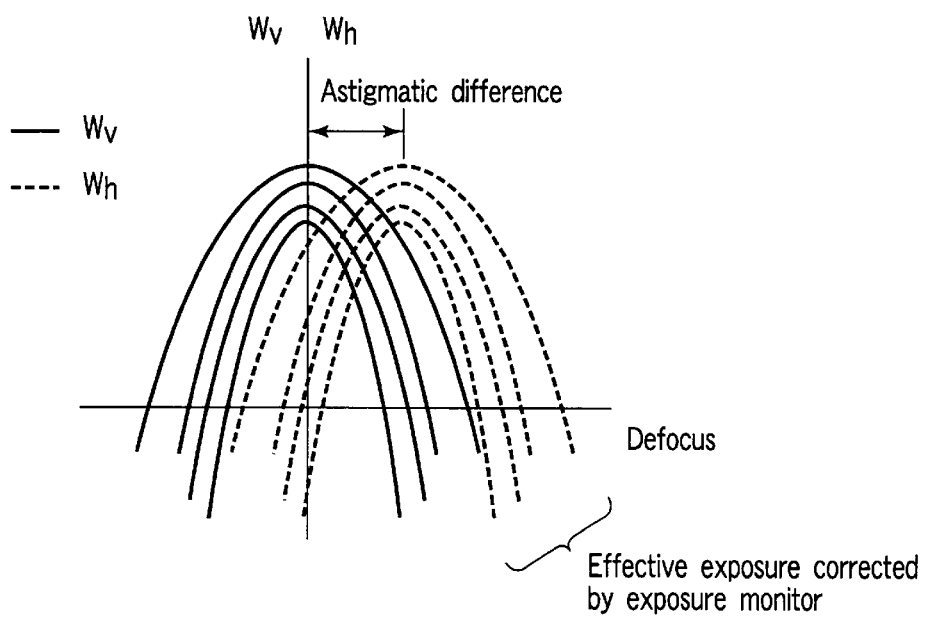
FIG. 13 is a graph showing the dependence of the focus monitor mark in two directions relative to the effective exposure on the pattern lengths Wv and Wh, which was obtained as a result of the exposure of the focus monitor mark shown in FIG. 12.
Figure 14:
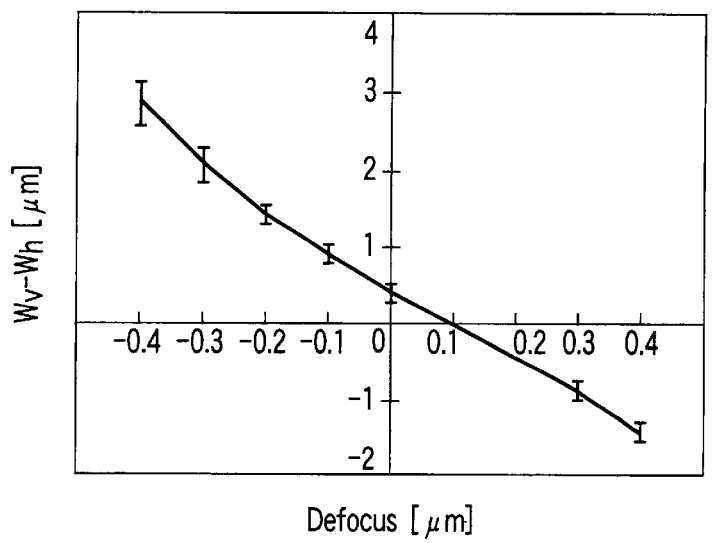
FIG. 14 is a graph showing the changes in the difference between the pattern lengths Wv and Wh relative to the defocus amount.

FIG. 13 shows the dependence of the focus monitor patters in two directions relative to the effective exposure obtained as a result of the exposure of the focus monitor marks 1201 and 1202 shown in FIG. 12 on the patterns lengths Wv and Wh after the exposure. The present inventor paid attentions to the feature that, although the pattern lengths Wv and Wh themselves are changed depending on the exposure, the difference between the pattern lengths Wv and Wh is not appreciably changed relative to the change in the exposure in the vicinity of the just focus. Such being the situation, the dependence of the difference between the pattern lengths Wv and Wh when the effective exposure is changed on the deviation amount of the focus was examined on the basis of FIG. 13 so as to obtain a correcting curve as shown in FIG. 14. It is possible to obtain the deviating amount including the deviating direction of the focus from the difference between the pattern lengths Wv and Wh by utilizing the correcting curve of the focus shown in FIG. 14 so as to feed the deviating amount of the focus back to the focus position set in the exposure device.

Incidentally, the experiment of this time covers the case where the aberration other than the astigmatism difference was not prominent relative to the pattern in the direction of 0° and the pattern in the direction of 90°. However, in the cases where the other aberrations are prominent, where the difference in shape generated in the mask preparation process between the pattern in the direction of 0° and the pattern in the direction of 90° is prominently large, where the deviation amount of the focus is large, and where the precision of the focus monitoring is increased, it is effective to use a correcting curve prepared in view of not only the difference between the pattern lengths Wv and Wh obtained from the focus monitor pattern but also the effective exposure obtained from the exposure monitor pattern.

Also, used this time were the mark in the direction of 0° and the mark in the direction of 90°. However, the directions of the mark are not particularly limited to 0° and 90° exemplified above as far as the marks differ from each other in the best focus position.

Because of the results described above, it has been made possible to perform the monitoring in also the deviating direction of the focus so as to make it possible to correct the deviating amount of the focus with a higher accuracy. It follows that the exposure can be applied to the wafer within the product lot under the state that always permits obtaining the maximum exposure margin so as to suppress the decrease of the yield.

Figure 15:
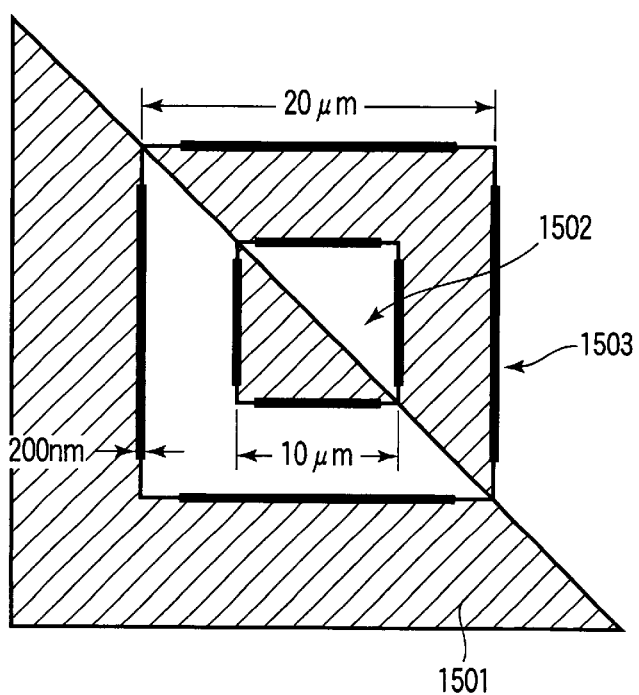
FIG. 15 schematically shows the construction of the focus monitor mark for measuring the changes of the focus amount as the positional deviation of the pattern.

Also, as another method of monitoring the deviating amount of the focus position without being affected by the change in the exposure, it is possible employ the technology of measuring the change of the focus as a positional deviation of the resist pattern by using a mark of a phase shift mask type. For example, it is possible to use a mask described in "Phase shift focus monitor application to Lithography tool control (D. Wheeler et al. SPIE vol. 3051 p. 225–223", which is shown in FIG. 15, as a focus monitor mark of the type that the change of the focus is measured as the positional deviation of the resist pattern. In FIG. 15, a reference numeral 1501 denotes a phase shifting glass, a reference numeral 1502 denotes a phase no-shifting glass, and a reference numeral 1503 denotes a light shielding film. In the correcting method using the particular mark, the exposure is performed by changing the defocus position relative to the focus monitor mark, the relationship between the amount of the positional deviation obtained by an inspecting apparatus of the alignment deviation and the deviating amount of the focus is obtained as a correcting curve, and the particular relationship is feedback from the correcting curve to the focus position set in the exposure apparatus.

Figure 16A:
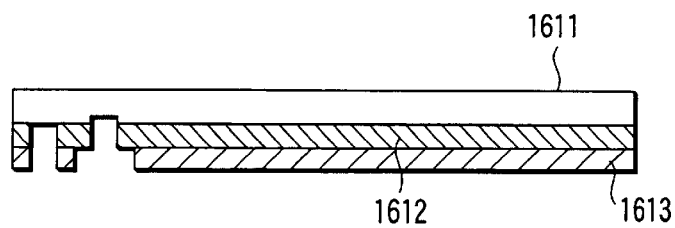
FIGS. 16A and 16B collectively show schematically the construction of the focus monitor mark for measuring the deviation amount of the focus position without being affected by the change in the exposure.
Figure 16B:
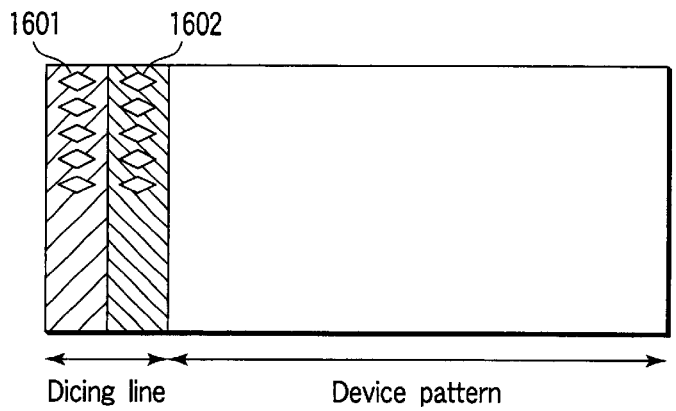
Figure 17:
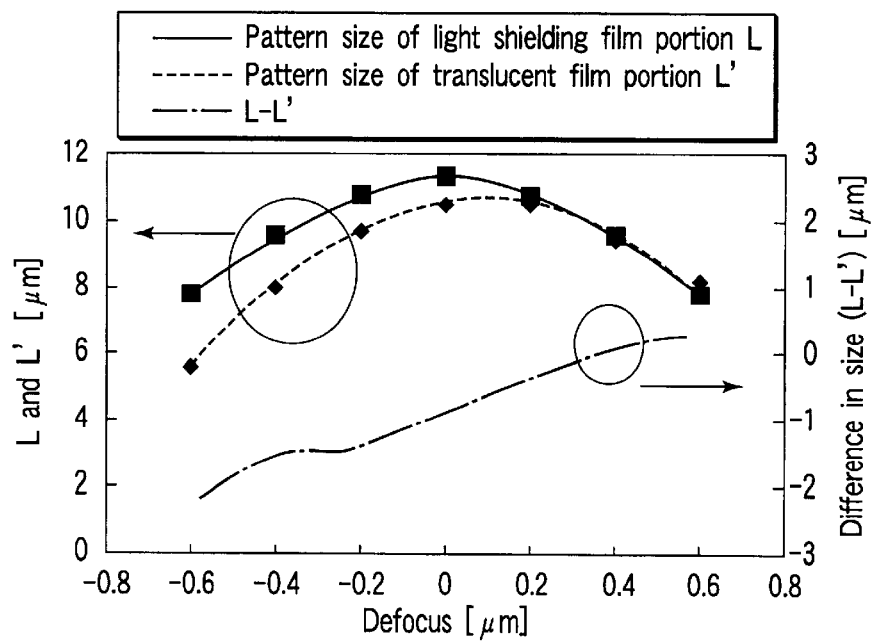
FIG. 17 is a graph showing the relationship between the size of the resist pattern formed by using the focus monitor mark shown in FIGS. 16A, 16B and the deviation in the focus position.

An applicable focus monitor mark other than the focus monitor mark referred to above will now be described as the technology for monitoring the deviation amount of the focus position without being affected by the change inn the exposure. FIGS. 16A and 16B collectively show schematically the construction of the focus monitor mark. Specifically, FIG. 16A is a cross sectional view showing the focus monitor mark, and FIG. 16B is a plan view showing the focus monitor mark.

The monitor mark is formed in a light-shielding portion (dicing line) in which the device pattern of the mask is not formed. In FIGS. 16A and 16B, a reference numeral 1611 denotes a transparent substrate made of, for example, glass, a reference numeral 1611 denotes a translucent film, and a reference numeral 1613 denotes a light shielding film. As shown in the drawings, a diamond mark (first open portion) 1601 is formed in the light shielding film 1613. Also, a diamond mark (second open portion) 1602 is formed in the translucent film 1612. Incidentally, the translucent film 1612 has a transmittance of 6% relative to the exposure light and has a function of deviating the phase by 180°.

In the first pattern region in which the diamond mark is formed and in the second pattern region in which the diamond mark 1602 is formed, five marks are arranged at a prescribed pitch. Also, each of the diamond marks 1601 and 1602 has a length of 12 μm in the direction of x-axis in terms of the wafer, a width of 0.18 μm in the y-axis direction, and a pitch of 0.36 μm. Incidentally, in the portion of the diamond mark 1602, which is a second open portion, the substrate is dug in an amount of the phase difference of 90° between the exposure light passing through the translucent film 1612 and the exposure light passing through the diamond mark 1602. In this case, a deviation takes place between the focus position of the diamond pattern formed on the wafer by the diamond mark 1602 of the translucent film portion and the focus position of the diamond pattern formed on the wafer by the diamond mark 1601 of the light shielding portion so as to exhibit different pattern size characteristics relative to the focus position. If the difference in the pattern size after the exposure and the development between these two marks is monitored, the difference in the pattern size is monotonously decreased or increased. It is possible to obtain by utilizing the phenomenon pointed out above the relationship of the difference in the pattern size relative to the defocus as a correcting curve as shown in FIG. 18. It is possible to perform the monitoring including the direction of the amount of deviation of the focus by measuring the difference (L–L') in the pattern size on the wafer after the exposure and the development by utilizing the result noted above. The focus monitor mark is featured like the mark described previously in that, although the mutual pattern length is certainly changed by the change in the exposure, the difference between the two is not appreciably changed by the change in the exposure.

For further improving the sensitivity, a mark having an accuracy higher than that of the focus monitor mark shown in FIGS. 16A and 16B will now be described. Specifically, a diamond mark formed of a translucent film was arranged as a monitor mark for measuring the focus position. The diamond mark differs from the mark described previously in that a translucent film is formed in each of the first and second pattern regions, that a phase difference of +90° was imparted to the first pattern region of the diamond mark, and that a phase difference of –90° was imparted to the second patter region. In the first pattern region, the phase of the exposure light passing through the translucent film was deviated by +90° relative to the exposure light passing through the open portion. Also, in the second pattern region, the phase of the exposure light passing through the translucent film was deviated by –90° relative to the exposure light passing through the open portion. It should be noted that the amount of deviation between the focus position of the diamond mark of the translucent film portion whose phase was deviated by 90° relative to the exposure light passing through the open portion and the focus position of the diamond mark formed in the light shielding film portion is changed by the amount equal to the of the mark described previously. On the other hand, the focus point of the diamond mark of the translucent film portion whose phase was deviated by –90° relative to the exposure light passing through the open portion was deviated by the amount equal in the absolute value and opposite in the symbol to the deviation amount noted above. As a result, it is possible to realize the detection sensitivity of the focus deviation amount twice as high as that for the mark described previously.

Incidentally, in this embodiment, the focus monitor pattern was measured by using an optical line width measuring apparatus independent of the exposure apparatus. However, it is also possible to use a measuring apparatus other than the optical type apparatus, e.g., a measuring apparatus incorporated in the exposure apparatus itself such as the line width measuring function and an SEM. Also, it suffices for the monitor mark to be of an optional shape as far as the pattern formed in the resist film can be measured by the line width measuring device. For example, it is possible for the monitor mark to be of a wedge shape. It is not absolutely necessary for the tip of the diamond shape or the wedge shape to be sharpened. In other words, if the tip portion is formed thinner than the central portion, the function of the focus monitor mark can be produced. The focus detecting function can be further improved by changing in various fashions the shape of the monitor mark depending on the exposure conditions employed.

Also, it is possible to reverse the relationship between the light shielding portion and the open portion in the first pattern region of the focus monitor mark shown in FIGS. 16A and 16B. To be more specific, it is possible for the first pattern region to have a monitor mark formed of a diamond-shaped or a wedge-shaped light shielding film surrounded by the open portion. Likewise, it is possible for the relationship between the translucent film portion and the open portion in the second pattern region to be reversed. To be more specific, it is possible for the second pattern portion to have a monitor mark formed of a diamond-shaped or a wedge-shaped translucent film surrounded by the open portion. The effect similar to that produced by this embodiment of the present invention can be obtained by any of these combinations.

In this embodiment of the present invention, used was the translucent film 1612 having a phase difference of 90° in order to allow the exposure light passing through the periphery of the diamond-shaped mark 1602 to have a phase difference relative to the exposure light passing through the diamond-shaped mark 1602 in the second pattern region. However, the phase difference is not limited to 90° as far as the phase difference brings about a change in the best focus position between the diamond-shaped mark 1601 of the light shielding portion and the diamond-shaped mark 1602 of the translucent film portion. Also, it is possible to use, for example, $SiO_2$, MoSiON, MoSiN, CrF, or ZrSiO for forming the translucent film.

FIG. 19 is a graph showing the detection sensitivity of the focus relative to the difference in phase between the translucent film portion and the transmitting portion in the focus monitor mark shown in FIGS. 16A and 16B. As apparent from the graph of FIG. 19, the required detection accuracy of the focus deviation amount is about 0.05 µm. If the measuring accuracy of the line width measuring apparatus is about 0.02 µm, the limit of the detection sensitivity required for the focus monitor is 0.8 µm, as given below:

$$A=B/C=|\Delta L-\Delta L'|/|\Delta Focus|=0.8$$

Where A represents the sensitivity, B represents the difference in size, and C represents the defocus.

It follows that it is desirable to set the phase difference to fall within a range of between 45° and 150°.

It is also possible to use the mark disclosed in Jpn. Pat. Appln. KOKAI Publication No. 2000-12425, which is of the type of utilizing the measurement of the thickness of the resist film, as an applicable exposure monitor mark other than the mark shown in FIG. 3.

Further, it is possible to use as another type of the mark an exposure monitor mark, which permits monitoring the exposure easily, rapidly and highly accurately by using a misalignment length measuring device of a misalignment inspecting apparatus. An example of the application will now be described in detail.

A part of the mark used in the conventional inspecting apparatus of a positional misalignment was changed into a mark that permits detecting the amount of change in the exposure as a positional deviation of the pattern. If the mark satisfies the conditions of formula (3) given previously, in which the wave length of the exposure light used is λ, the number of apertures used is NA, the magnification of the mask is M, the coherent factor is σ, and the pitch is P in terms of the wafer, it is possible to form a resist pattern having a distribution of the gradient of the dose that is not dependent on the state of the focus on the wafer. The change in the exposure was monitored by the misalignment inspecting apparatus as a relative positional deviation amount between the outside pattern and the inside pattern of the resist pattern after the exposure.

Figure 20:
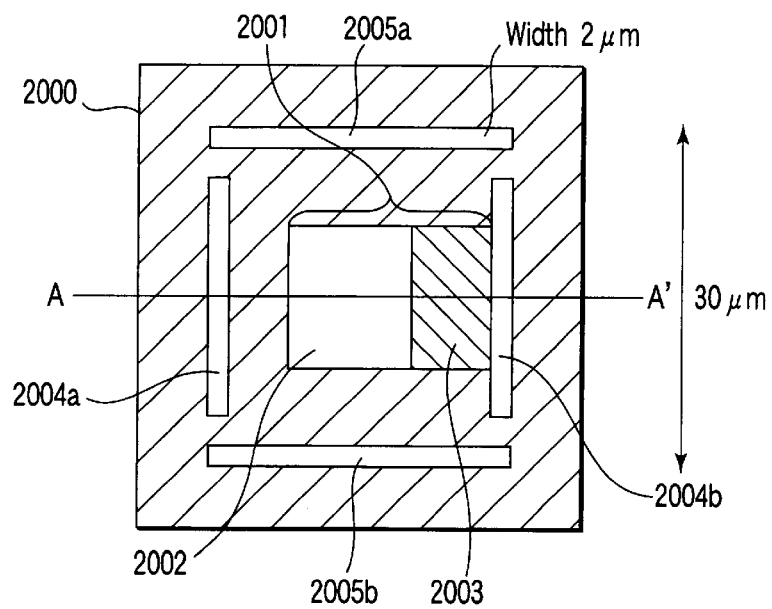
FIG. 20 is a plan view schematically showing the construction of the exposure monitor pattern used for obtaining the effective exposure that is not dependent on the focus position.

FIG. 20 shows the monitor mark 2000. Arranged in the monitor mark 2000 shown in FIG. 20 are a pair of marks 2004 (2004a, b) for detecting the relative positions and an exposure monitor mark 2001, which is sandwiched between these marks for detecting the relative positions, in the direction of the x-axis (one direction). Also, a pair of marks 2005 (2005a, b) for detecting the positional deviation in the y-axis direction are arranged to have the exposure monitor mark 2001 sandwiched there between with respect to the y-axis perpendicular to the x-axis. The exposure monitor mark comprises an open portion 2002 and an exposure monitor section 2003 connected to the pattern in the direction of the x-axis and having an irradiation intensity distribution of the transmitting exposure light that is monotonously changed in the direction of the x-axis.

Figure 21:
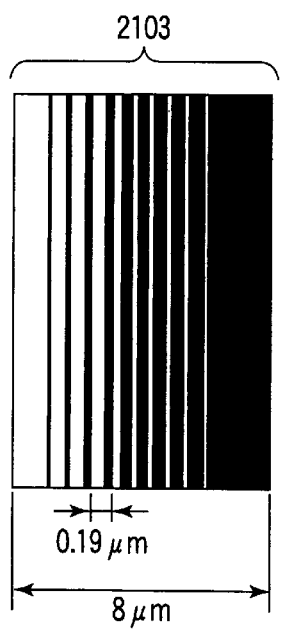
FIG. 21 schematically shows the construction of the exposure monitor section of the exposure monitor mark shown in FIG. 20.

FIG. 21 schematically shows the construction of the exposure monitor section 2003 arranged in the exposure monitor mark 2001. In the exposure monitor section 2003 shown in FIG. 21, the pitch P on the wafer was set at 0.19 µm, which was not smaller than the resolution limit in accordance with the exposure device used having the wavelength of the exposure light of 248 m, NA of 0.68, σ of 0.75, and the annular shielding rate of ⅔, and the exposure monitor section 2003 was formed by arranging patterns having the duty ratio of the transmitting portion to the light shielding portion in which the transmitting portion was increased by 0.625 nm relative to the preceding transmitting portion so as to realize a consecutive distribution of the image intensity, which is not dependent on the focus on the wafer surface, ranging between 0 and 1.

FIG. 22 shows the light intensity distribution on the resist film corresponding to the A–A' portion of the exposure monitor mark 2000. In FIG. 22, a reference numeral 2200 denotes the edge light intensity in which an edge is formed on the resist film. Also, a reference numeral 2212 shown in FIG. 22 denotes the intersection between the exposure light passing through the aperture pattern 2002 and the edge light intensity 2200, and a reference numeral 2213 denotes an intersection between the exposure light intensity transmitting through the exposure monitor section 2003 and the edge light intensity 2200. Further, reference numerals 2204a, 2202, 2203 and 2204b denote the positions corresponding to the marks 2004a, 2002, 2003 and 2004b formed in the monitor mark 2000.

FIG. 23 shows the A–A' line cross sectional shape of the resist pattern finally obtained by exposing the developing the exposure monitor mark shown in FIG. 20. A reference numeral 2301 shown in FIG. 23 denotes an exposure monitor pattern formed to correspond to the exposure monitor mark 2001, reference numerals 2302 and 2303 denote the edge forming positions formed to correspond to the aperture pattern 2002 and the exposure monitor section 2003, and reference numerals 2304a and 2304b denote the patterns for detecting the relative positions formed to correspond to the pattern 2004 for detecting the relative positions.

Where the exposure is changed, the change appears as a change of the edge light intensity 2200, and the edge forming position 2213 is changed by the exposure monitor section 2003. As a result, the position of the edge 2213 of the corresponding exposure monitor pattern is shifted. As a result, the change in the appropriate value of the exposure can be detected as a relative positional deviation amount Δ between the center position M' of the exposure monitor pattern 2301 and the center position M of the patterns 2304a and 2304b for detecting the position of the apparatus.

Figure 24:
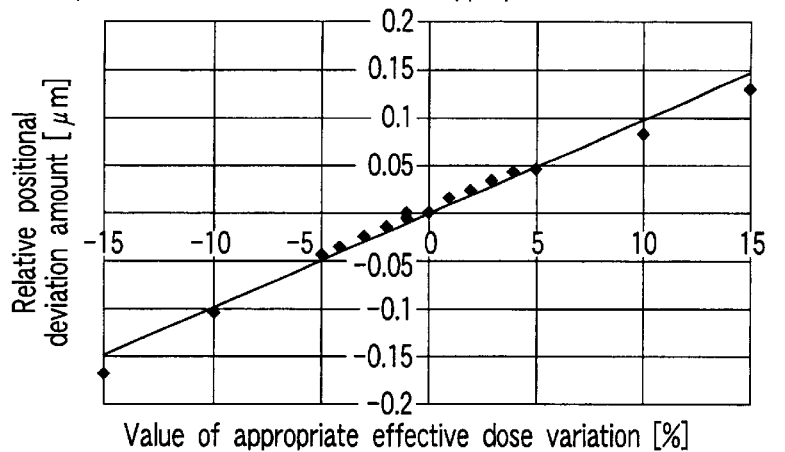
FIG. 24 is a graph showing the correcting curve for obtaining the effective exposure from the resist pattern finally obtained by exposing and developing the exposure monitor mark shown in FIG. 20.

In order to monitor the effective exposure by using the exposure monitor pattern described above, the deviation amount of the relative position relative to the change from the appropriate exposure is obtained in advance as a correcting curve as shown in FIG. 24. In this case, it is possible to monitor the change in the effective exposure by a method similar to that described above.

Incidentally, the exposure monitor mark of this type is not limited to that shown in FIG. 20. It is possible to use an exposure monitor mark in which is arranged an exposure monitor section constructed such that at least a part of the mark for inspecting the positional deviation for alignment is changed into a pattern in which the irradiation amount distribution is consecutively changed on the wafer surface, said exposure monitor section being constructed such that the positional deviation amount for alignment is obtained, and a change in the value of the effective exposure is obtained by using the value of the positional deviation amount thus obtained so as to feedback the change in the value of the effective exposure.

Figure 25A:
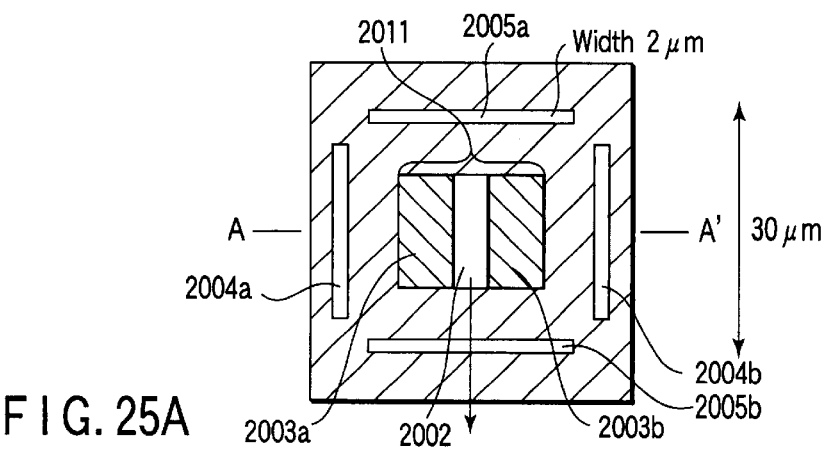
FIGS. 25A and 25B are plan views collectively showing schematically the construction of a modification of the exposure monitor mark shown in FIG. 20.
Figure 25B:
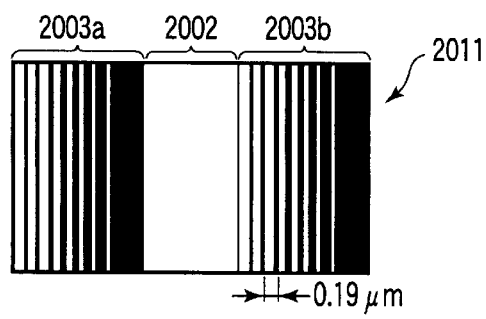
Figures 26A, 26B, 26C, 26D:
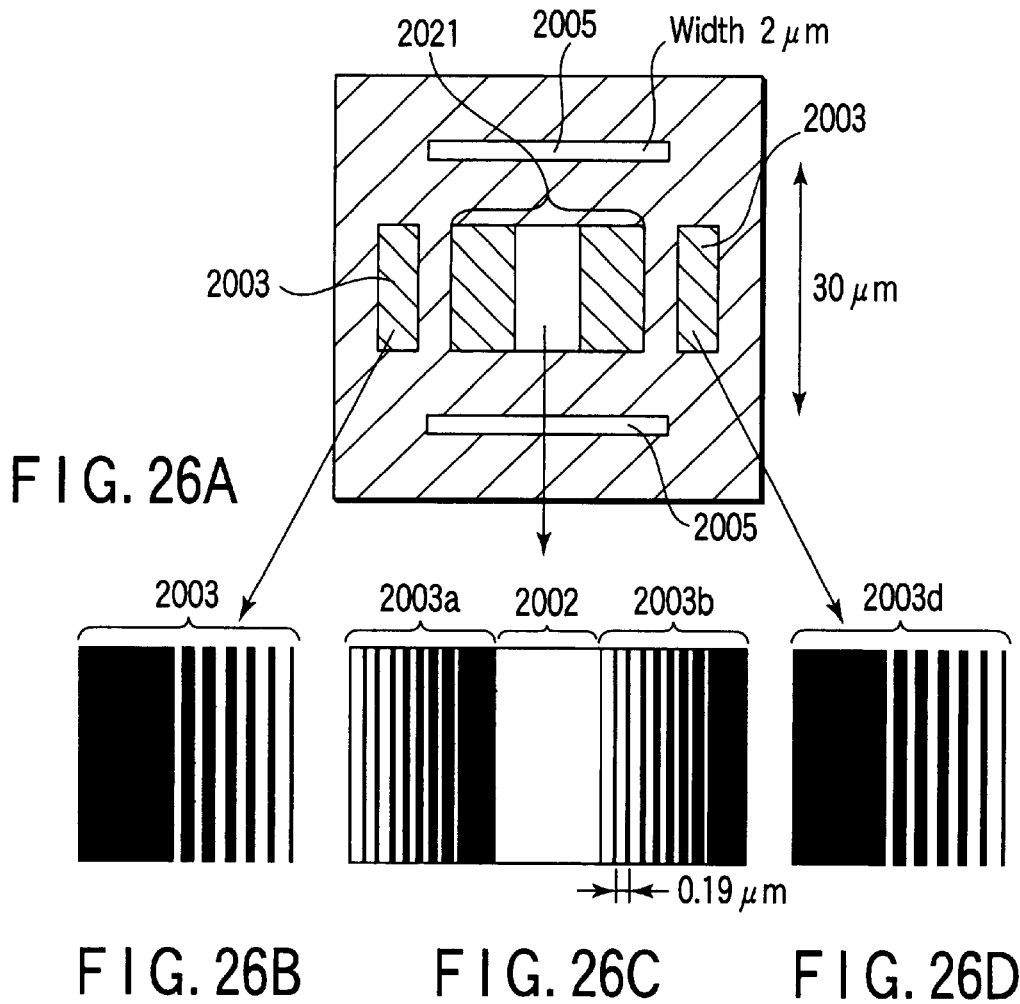
FIGS. 26A to 26D are plan views collectively showing schematically the construction of a modification of the exposure monitor mark shown in FIG. 20.

For improving the detection sensitivity, it is effective to arrange two or four exposure monitor section as shown in FIGS. 25A, 25B and FIGS. 26A to 26D. The detection sensitivity can be further improved by adding the exposure monitor sections in the y-axis direction, too. FIG. 25A is a plan view schematically showing the construction of the exposure monitor mark. FIG. 25B schematically shows the construction of the exposure monitor pattern 2011 included in the exposure monitor mark shown in FIG. 25A. FIG. 26A is a plan view schematically showing the construction of an exposure monitor mark. FIG. 26B is a plan view schematically showing the construction of an exposure monitor pattern 2003c included in the exposure monitor mark shown in FIG. 26A. FIG. 26C is a plan view schematically showing the construction of an exposure monitor pattern 2021 included in the exposure monitor mark shown in FIG. 26A. Further, FIG. 26D is a plan view schematically showing the construction of an exposure monitor pattern included in the exposure monitor mark shown in FIG. 26A.

The description given above covers cases where various exposure monitor marks and focus monitor marks are used for monitoring the effective exposure and the focus. However, the exposure monitor mark and the focus monitor mark used in the present invention are not limited to those used in the embodiment described above. It is possible for the focus monitor mark to be a mark for forming a resist pattern that is not dependent on the exposure and is dependent on the focus alone or to be a mark for obtaining the focus position that is not dependent on the exposure by using an effective exposure that is not dependent on the focus position. On the other hand, it is possible for the exposure monitor mark to be a mark for forming a resist pattern without relying on the focus position and relying solely on the exposure. In other words, it is possible to obtain the exposure and the focus separately by using the exposure monitor mark and the focus monitor mark constructed as described above so as to feed the exposure and the focus thus obtained back to the next lot.

Also, in the example described above, the value of the exposure set in the exposure device was modified for the individual wafers included in the next lot to which the exposure and the focus are feedback. However, it is also possible to modify the value other than the set value of the exposure.

Figure 27:
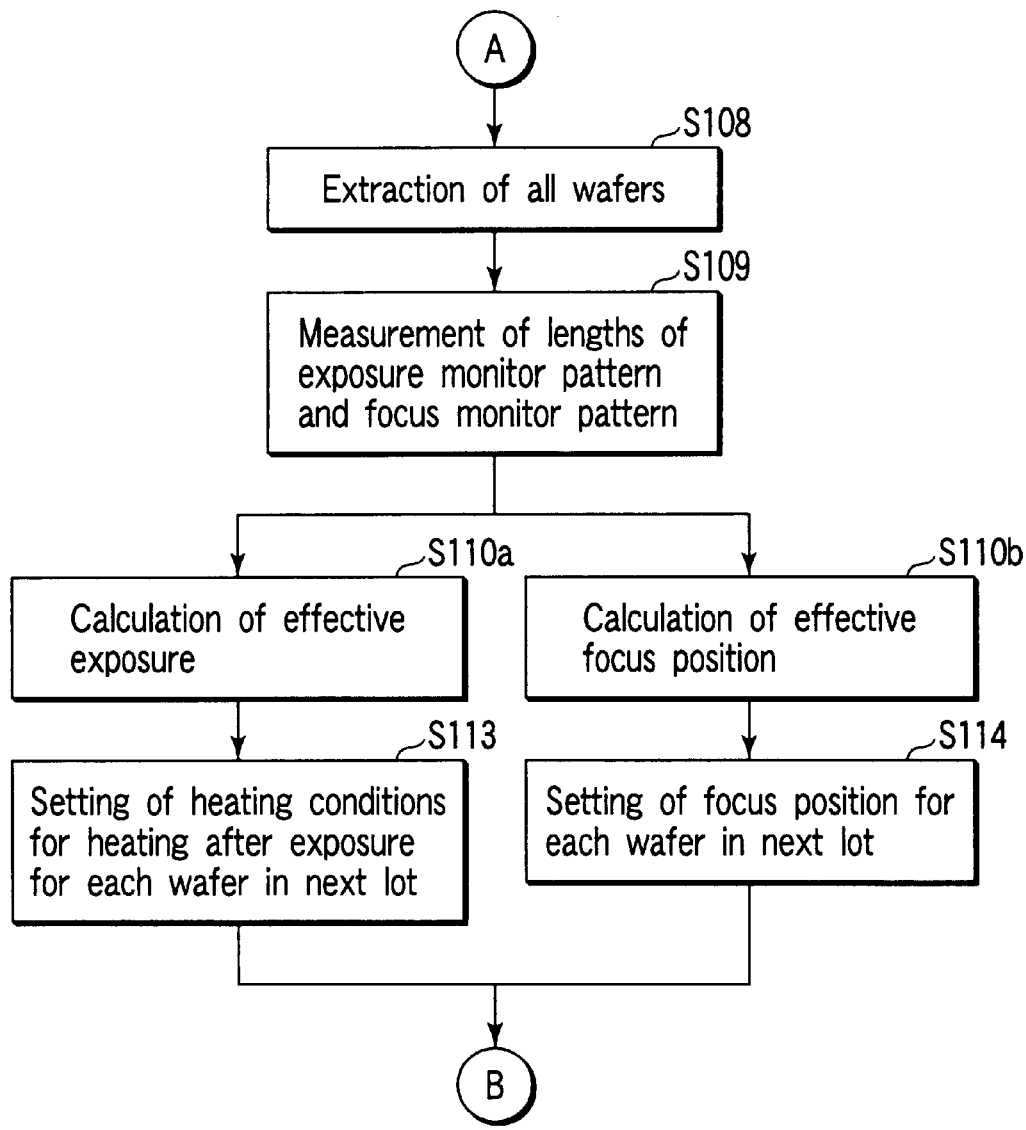
FIG. 27 is a flow chart showing a modification of the method of controlling the semiconductor manufacturing process according to the first embodiment of the present invention.
Figure 28:
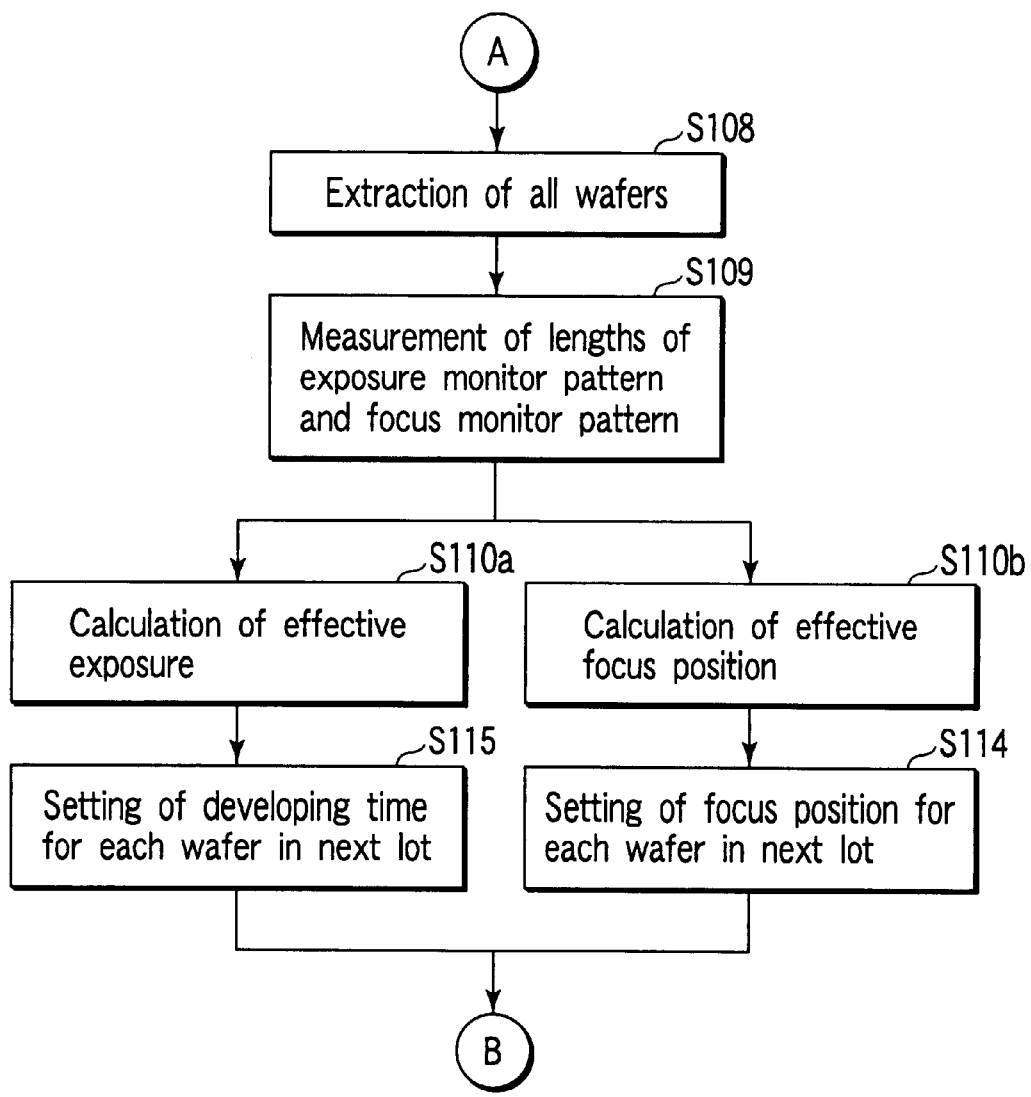
FIG. 28 is a flow chart showing a modification of the method of controlling the semiconductor manufacturing process according to the first embodiment of the present invention.

As shown in FIG. 27, the lengths of the exposure monitor pattern and the focus monitor pattern are measured (step S109), followed by calculating the effective exposure and the effective focus position that are not dependent on the focus position (steps S110a, S110b). It is possible to construct the system such that the time for the post-exposure heating of each wafer within the next lot or the heating conditions such as the PEB temperature are set based on the effective exposure thus obtained (step S113), and the set value of the focus position for each wafer within the next lot is obtained from the effective focus position thus obtained (step S114). Alternatively, it is possible to construct the system such that the modified value of the developing time for each wafer within the next lot is obtained from the calculated effective exposure (step S115), as shown in FIG. 28. Incidentally, the steps shown in FIGS. 27 and 28 are carried out in place of the steps sandwiched between marks A and B shown in FIG. 1.

Incidentally, it is possible to control at least one condition selected from the group consisting of the set value of the focus position, the set value of the exposure, the heating condition for the heat treatment, the developing condition for the developing treatment, the residence time between the completion of the exposure treatment and the start-up of the second heat treatment, the residence time between the completion of the second heat treatment and the start-up of the second cooling treatment, the residence time between the completion of the second cooling treatment and the start-up of the developing treatment, the residence time between the completion of the resist film coating and the start-up of the first heat treatment, the residence time between the completion of the first heat treatment and the start-up of the first cooling treatment, and the residence time between the completion of the first cooling treatment and the start-up of the exposure in addition to the set value of the exposure and the developing time. It should be noted that it is possible to control any parameter affecting the effective exposure and the focus and, thus, the controlled parameter is not limited to the process conditions pointed out above.

It is also possible to measure the latent image formed in the resist film by the exposure of the exposure monitor mark and the focus monitor mark so as to obtain the exposure and the focus position in place of measuring the exposure monitor pattern and the focus monitor pattern.

Second Embodiment

The second embodiment is directed to an example that is effective for suppressing the change in the size of the pattern within the lot in the case where a plurality of lots are successively subjected to the processing. On the other hand, the first embodiment described previously was directed to the example effective for the lot processing of a relatively small scale, particularly, to the example in which attentions were paid to the situation that the process unit conditions for each wafer within the lot are systematically aligned as in the case of exposure where the scale of the lot subjected to a single processing constitutes a single lot unit.

To be more specific, the first embodiment is directed to a control method effective for the case where the wafer in the same slot of the lot exhibits a relatively similar tendency in any lot in respect of the conditions such as the waiting time of the process unit. However, where the scale of the lot is enlarged and many lots are successively subjected to the processing at a time, it is impossible for the control method in the first embodiment to perform the effective control in many cases because the processing interval relative to the preceding lot and the state of the lot are rendered different under the influence given by the preceding lot.

Under the circumstances, the step of performing a comparison with the data on the history of processing of each unit process applied to each wafer of the lot is added to the control method in the second embodiment relative to the distribution in the change of the effective exposure and the distribution in the change of the focus within the lot, which are obtained as a result of the application of the first embodiment.

Therefore, the step of extracting the information as to which process conditions of which unit most greatly affect these changes judging from the compared data, i.e., the step of extracting the process unit conditions having a high correlation, and the step of analyzing the correlations so as to calculate the correlations between the two are newly added to the control method according to the second embodiment of the present invention. As a result, the present inventor has arrived at the control method that permits offsetting in advance the difference in the process conditions in the subsequent unit process based on the data thus obtained.

The specific procedures will now be described with reference to FIGS. 29 and 30. Incidentally, the exposure conditions, etc. are set equal to those for the first embodiment.

Step S201 to S210

An exposure was applied to a single lot in accordance with the procedure for the first embodiment (steps S101 to S109) so as to obtain the distribution in the change of the effective exposure in the lot (FIG. 9) and the distribution in the change of the focus (FIG. 10).

Step S211

The distribution in the change of the effective exposure shown in FIG. 9 was compared with the history of each of the process conditions including the post-waiting time of the exposure treatment, the post-waiting time of the heat treatment after the exposure, the post-waiting time of the cooling treatment after the exposure, the post-waiting time of the resist film coating treatment, the post-waiting time of the heat treatment before the exposure and the post-waiting time of the cooling treatment before the exposure within the lot of the process of the coating-developing apparatus for each unit so as to analyze the correlations between the each treatment and the change in the exposure. Incidentally, the Post-waiting time of the treatment is residence time between the completion of a previous treatment and a start-up of the next treatment.

In the second embodiment, the correlations were obtained in respect of only the change in the exposure because the change in the focus position within the lot was small as already described in conjunction with the first embodiment. However, it is also possible to obtain the correlations in respect of the change in the focus position, too.

Step S212

The parameter having a high correlation is extracted from among the correlations obtained. In this embodiment, extracted was the post-waiting time in the heating unit before the exposure.

Step S213

Figure 31:
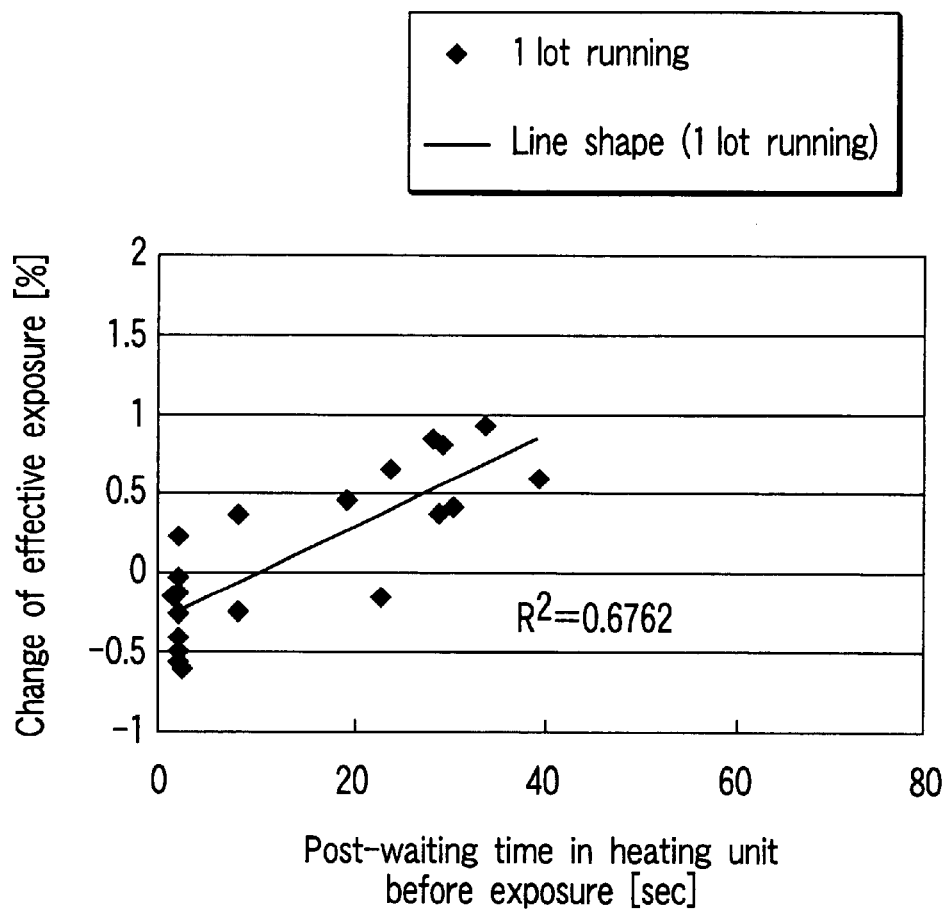
FIG. 31 is a graph showing the change in the effective exposure relative to the waiting time in the pre-exposure heating unit.

The influence given by the extracted post-waiting time in the heating unit before the exposure was analyzed so as to find that there is a relationship as shown in FIG. 31 between the post-waiting time in the heating unit before the exposure and the change in the effective exposure.

Step S214

Such being the situation, the post-waiting time in the heating unit before the exposure was set constant for each of the wafers for which it has been found that the change in the effective exposure is most seriously affected when the product lot or a lot of a large scale is subjected to the processing.

Steps S301 to S307

Figure 11:
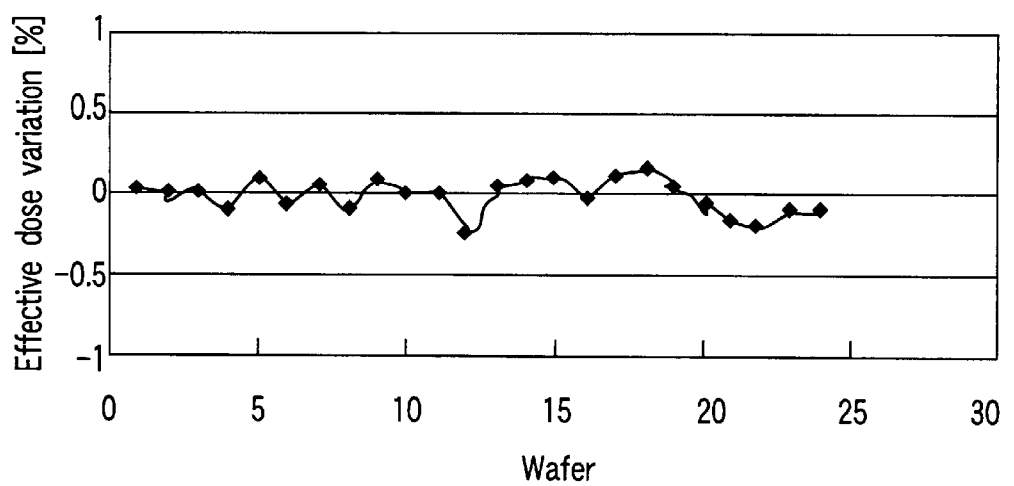
FIG. 11 is graph showing the distribution of changes in the effective exposure in a single lot.

The exposure and the development were performed with the post-waiting time in the heating unit before the exposure set constant when the product lot or a lot of a large scale was subjected to the processing. As a result, it has been found that it is possible to suppress such a change in the effective exposure as shown in FIG. 9 even in the case where a plurality of lots are successively processed so as to make it possible to obtain a uniform distribution, i.e., such a distribution as shown in FIG. 11, of the effective exposure in the wafers in the lot in any lot.

Figure 32:
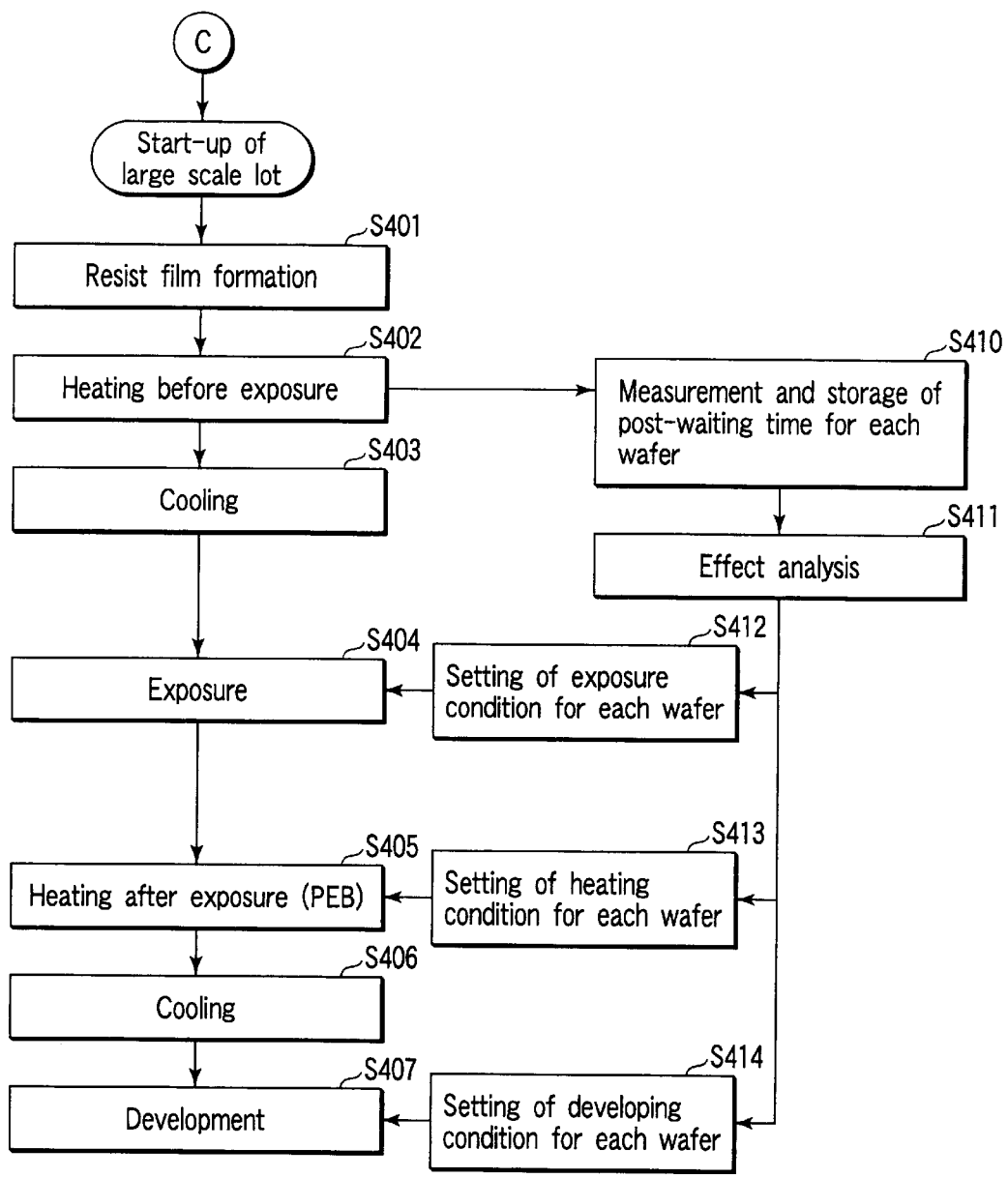
FIG. 32 is a flow chart showing a modification of the method of controlling the semiconductor manufacturing process according to the second embodiment of the present invention.

The control method described in the following is also effective. FIG. 32 is a flow chart showing a modification of the method of controlling the manufacturing process of a semiconductor device according to the second embodiment of the present invention. Incidentally, the series of steps shown in FIG. 32 are carried out after the series of steps shown in FIG. 30.

In this case, the process conditions having the highest correlations relative to the distribution of the change in the effective exposure are measured and stored for each wafer, and the subsequent process conditions are changed for each wafer based on the stored process conditions.

Step S410

Since it has been found in step S212 that the distribution of the change in the effective exposure and the post-waiting time in the heating unit before exposure have the highest correlations, the post-waiting time in the heating unit before exposure is measured and the result of the measurement is stored.

Step S411

The amount of change in the effective exposure is obtained for each wafer on the basis of the stored post-waiting time of each wafer and the relationship between the post-waiting time and the change in the effective exposure, which is obtained by the analysis carried out in step S213 and which is shown in FIG. 31.

Steps S412, S413 and S414

Processing was performed by applying a feed forward control from the obtained amount of change in the effective exposure for each wafer to the set exposure of the exposure apparatus, the heating process conditions after the exposure (at least one of temperature and time) and the developing time.

As a result, it has been found possible to suppress such a change in the effective exposure within the lot as shown in FIG. 9 so as to make it possible to obtain such a uniform distribution of the effective exposure as shown in FIG. 10 in the wafer in the lot in any lot.

Incidentally, it is an effective means for performing the control with a high accuracy to extract the wafer within the product lot, as required, so as to renew the information on the correlations.

In this embodiment, a prominent correlation between the change in the focus and the data on the distribution of the process history within the lot for each unit was not observed and, thus, control was not particularly applied to the change in the focus. However, it is possible to apply the control similarly if there are unit process conditions having a high correlation.

Incidentally, the post-waiting time of the heat treatment before exposure was the unit process condition having a high correlation in this case. However, it is also possible to apply the similar control to the other unit process conditions having a high influence depending on the resist process used.

Third Embodiment

In the second embodiment described above, the treatment giving an influence to the change in the effective exposure and the post-waiting time of the treatment were extracted, and the process conditions and the post-waiting time were changed in accordance with the extracted treatment and the post-waiting time of the processing so as to obtain a prescribed size. In the third embodiment, however, the developing conditions are changed in accordance with the extracted treatment and the post-waiting time of the treatment.

As described above, the finish size is affected, with various process conditions of each treatment included in the flow providing the parameters. In other words, the finish size W is determined by formula (4) given below:

$$W = f(X_1, X_2, \ldots X_n) \tag{4}$$

Where $X_k$ (k=1, 2, ..., n) represents the parameters in each treatment such as the bake temperature and the bake time.

If the correlation noted above is known in advance, it is possible to estimate the finish size of the resist pattern by using each parameter extracted from the wafer processing apparatus during the wafer processing.

It is possible for the correlation formula to be of a multiple regression function prepared by estimating the parameter favorably affecting the finish size of the resist pattern from the general multivariate analysis based on, for example, a preliminary experiment. In the case of the multiple regression function, the correlation is given by formula (5) given below:

$$W = A_0 + A_1 \times X_1 + A_2 \times X_2 + \ldots + A_n \times X_n \quad (5)$$

Even if the correlation given by formula (5) is unknown, it is possible to estimate the finish size, if there is a table showing the change in the finish size relative to each parameter.

In this embodiment, the finish size is estimated in the stage before the developing treatment by using formula (5) given above or a table on the assumption that the developing treatment was performed under prescribed conditions, e.g., for 60 seconds by using a 2.38% of TMAH aqueous solution.

The actually measured value of each parameter, e.g., the temperature under which the treatment was actually performed relative to the set temperature, is monitored by, for example, a sensor mounted to a wafer processing apparatus so as to be taken into the internal computer of the wafer processing apparatus or into an external computer.

If the parameter in each treatment is changed, a difference $\Delta W$ is generated between the finish size We and the target finish size Wt, i.e., $\Delta W = Wt - We$, where $\Delta W$ denotes an estimated value that is obtained in the case where the development is carried out under prescribed conditions. In other words, the relationship given above is not necessarily established, if the developing conditions such as the normality of the developing solution and the developing time are changed. It follows that it is possible to make the finish size equal to the target finish size by selecting the appropriate developing conditions, if the change in size relative to the normality and the developing time is known.

Specific examples will now be described.

Third Embodiment A

Figure 29:
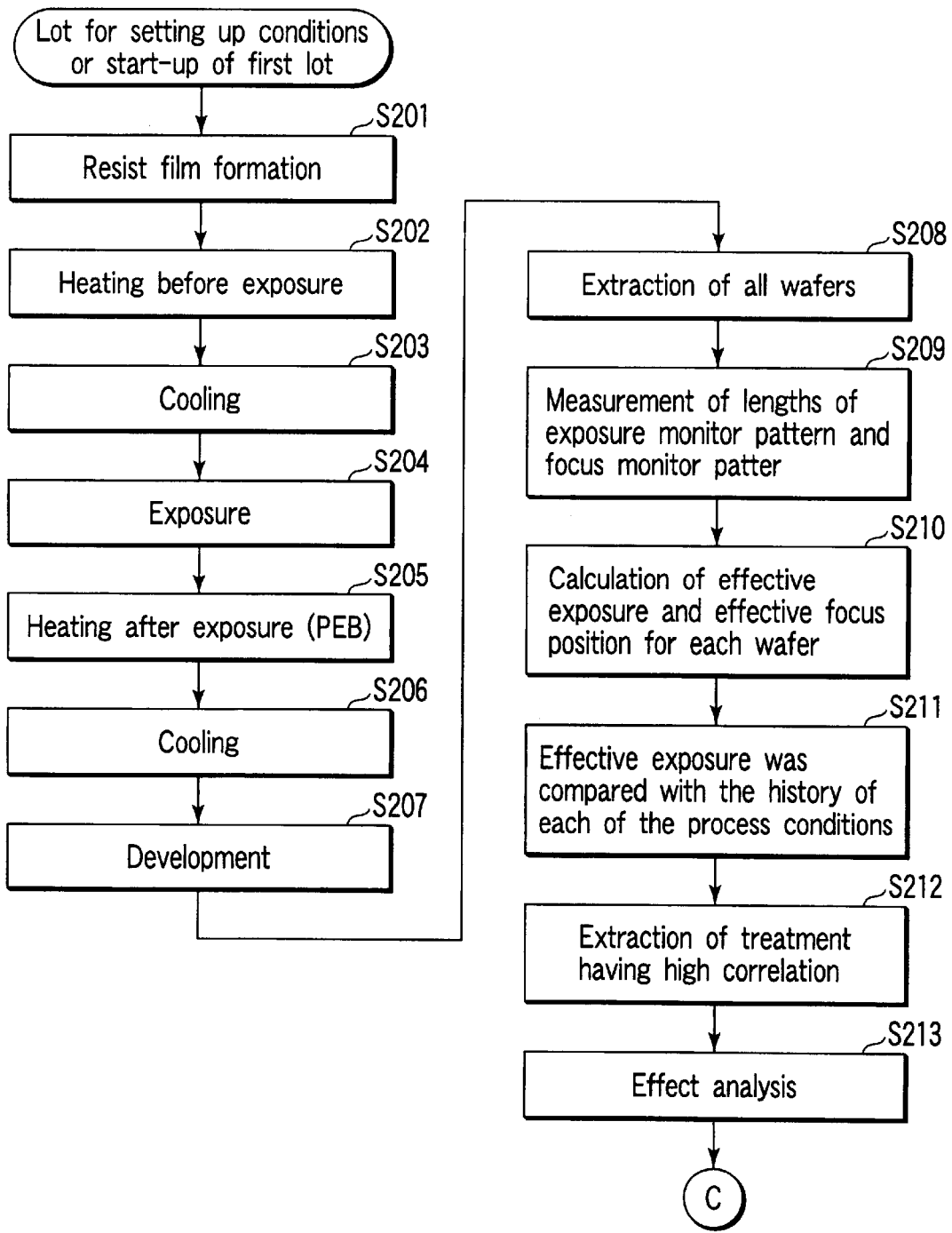
FIG. 29 is a flow chart showing a modification of the method of controlling the semiconductor manufacturing process according to a second embodiment of the present invention.
Figure 30:
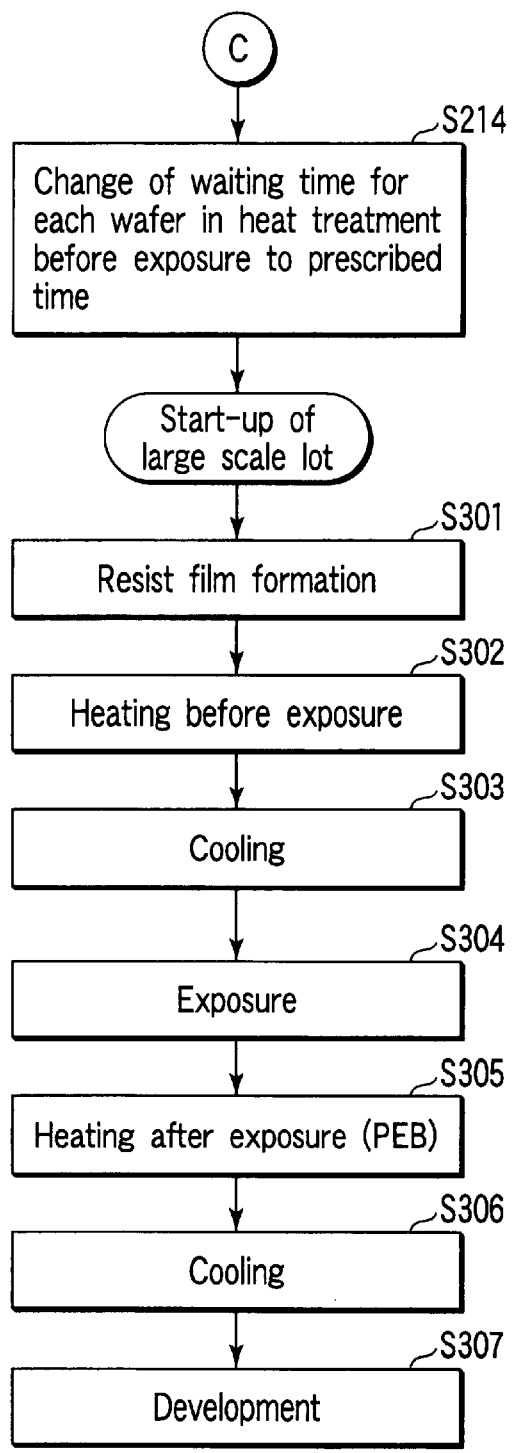
FIG. 30 is a flow chart showing a modification of the method of controlling the semiconductor manufacturing process according to the second embodiment of the present invention.

A single lot of wafers consisting of 9 wafers were consecutively subjected to exposure in accordance with steps S201 to S207 included in the flow chart shown in FIG. 29 as a preliminary experiment. Then, the change in the effective exposure for the resist pattern and the post-waiting time for each treatment were examined in accordance with steps S208 to S210. Incidentally, the post-waiting time was obtained by analyzing the treating log stored in the computer of the wafer processing apparatus. Incidentally, the cooling treatment (step S221), the coating of an antireflection film (step S222), the heating treatment (step S223) and the cooling treatment (S224) were successively carried out before formation of the resist film.

Figure 33:
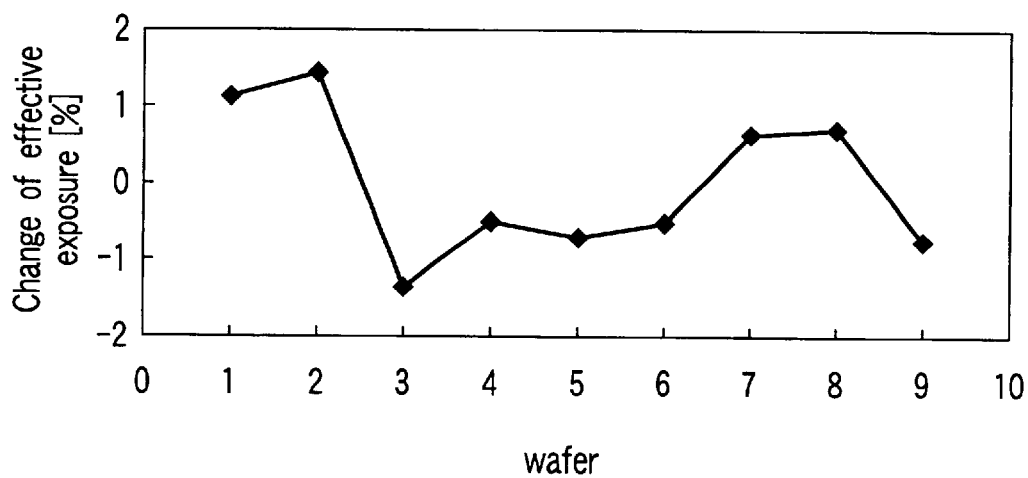
FIG. 33 is graph showing the distribution of changes in the effective exposure of each wafer within the lot according to the third embodiment A of the present invention.
Figure 34:
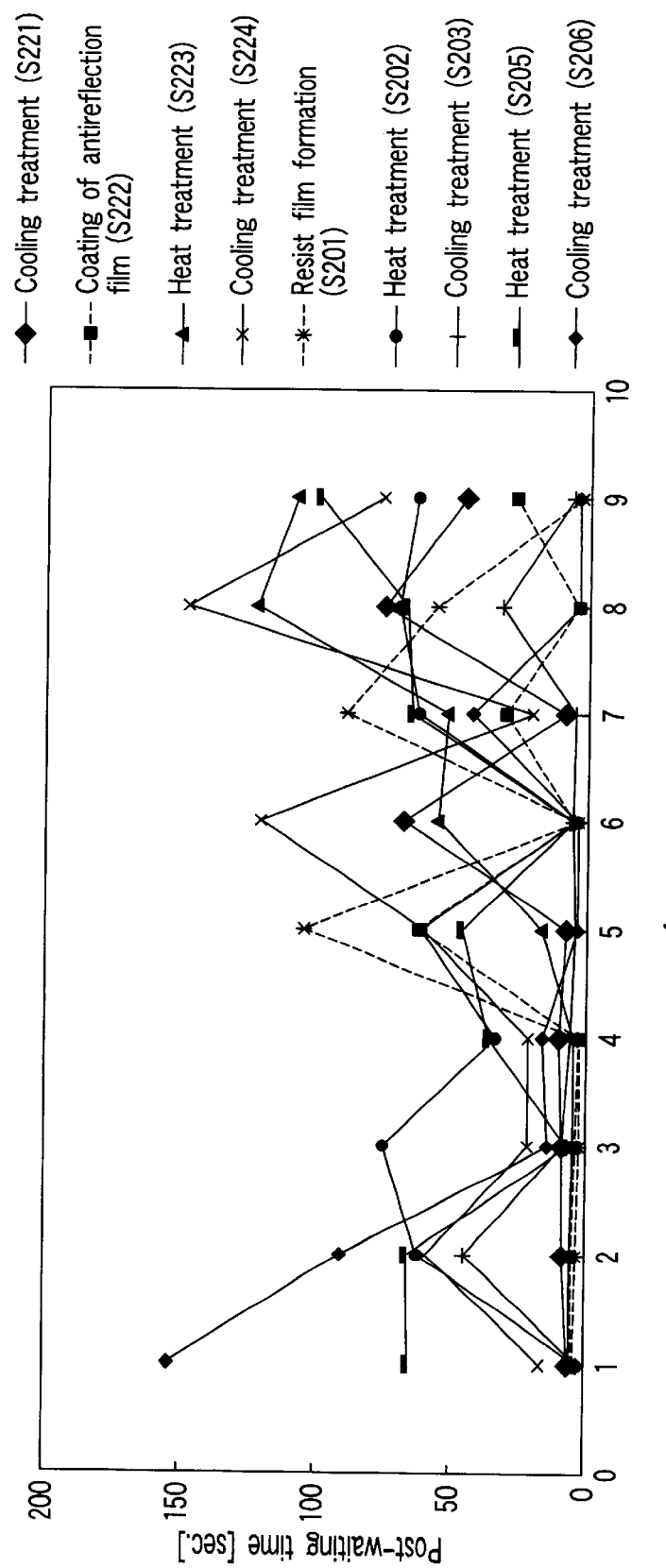
FIG. 34 is graph showing the post-waiting time for each treatment of each wafer within the lot according to the third embodiment A of the present invention.

FIG. 33 shows the change in the effective exposure for each wafer, and FIG. 34 shows the post-waiting time for each treatment. The relationship between the change in the effective exposure for each wafer and the post-waiting time for each treatment was examined (step S211). As a result, it has been found that the post-waiting time for the cooling treatment (step S203), the heating after the exposure (step S205) and the cooling treatment (step S206) affects the effective exposure (step S212). Under the circumstances, a regression analysis was performed so as to obtain the multiple regression function (6) given below (step S213):

$$E = -1.0787 + 0.0304 \times F + 0.0066 \times G + 0.00110 \times H \quad (6)$$

Where E represents the estimated effective exposure, F represents the post-waiting time of the cooling treatment (step S203), G represents the post waiting time of the heat treatment after exposure (step S205), and H represents the post-waiting time of the cooling treatment (step S206).

What is estimated is the effective exposure, not the finish size. It should be noted that the change in the waiting time causes the effective exposure to be changed, and the finish size is changed in accordance with the change in the effective exposure. It follows that the estimation of the effective exposure is equal in significance to the estimation of the finish size. Such being the situation, it is considered reasonable to understand that, if the correction is performed on the basis of the data on the effective exposure, it is possible to correct sufficiently the change in size.

Figure 35:
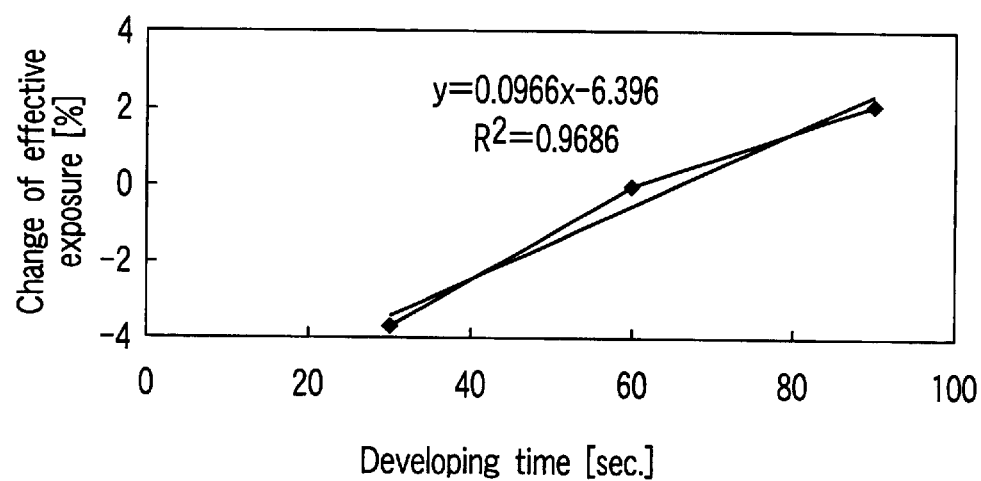
FIG. 35 is a graph showing the dependence of the change in the effective exposure on the developing time.

On the other hand, another preliminary experiment was conducted so as to obtain the dependence of the change in the effective exposure on the developing time. FIG. 35 is a graph showing the dependence of the change in the effective exposure on the developing time, which was obtained as a result of the preliminary experiment noted above. From the preliminary experiment, the change in the effective exposure relative to the developing time, i.e., dE/dt, in the vicinity of the standard developing time (60 seconds) was found to be as follows:

$$dE/dt = 0.096 \ [\%/\text{sec}] \quad (7)$$

Then, prepared was formula (8) given below as a formula for calculating the corrected developing time:

$$\begin{aligned} J &= K + dt/dE \times [L - M] \\ &= 60 \ [\text{sec}] + 1/0.0966 \times [0 - M] \end{aligned} \quad (8)$$

where J represents the corrected developing time, K represents the standard developing time, L represents the target effective exposure, and M represents the estimated effective exposure.

Figure 36:
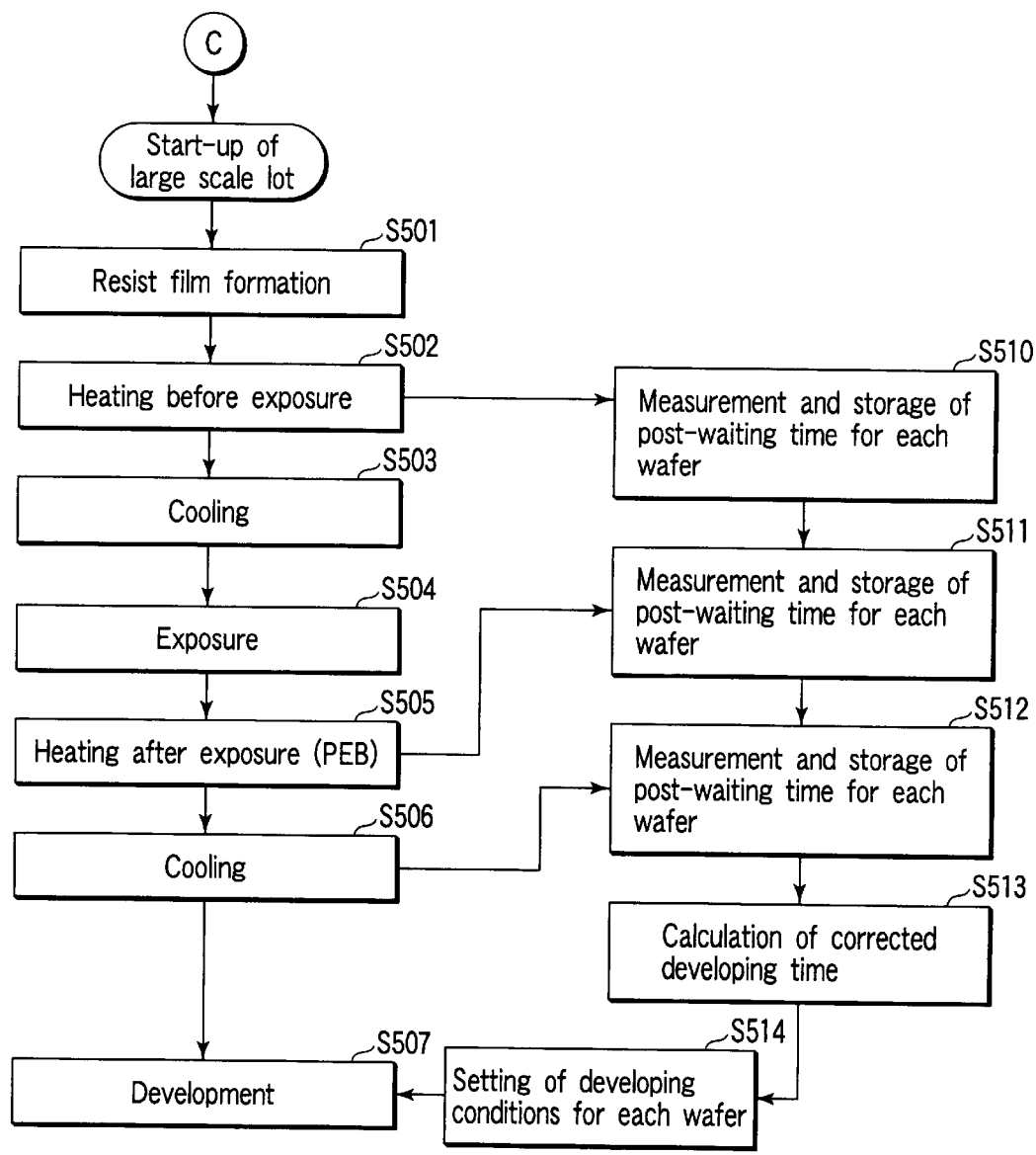
FIG. 36 is a flow chart showing a method for manufacturing a semiconductor device according to a third embodiment A of the present invention.

The exposure and development of the resist film of the product lot are carried out in accordance with the flow chart shown in FIG. 36. FIG. 36 is a flow chart showing the manufacturing process of a semiconductor device according to the third embodiment A of the present invention. Incidentally, the series of steps shown in FIG. 36 are carried out after the series of steps shown in FIG. 29.

In the exposure for the product lot, a single lot of wafers consisting of 24 wafers were subjected to the exposure and developing treatments (steps S501 to S507). During the processing, the post-waiting time was obtained on the real time basis for each of the cooling treatment (step S502), the heating treatment after the exposure (step S505), and the cooling treatment (step S506), followed by immediately calculating the corrected developing time for each wafer by using the formulas (6) and (8) given previously (step S513).

The developing treatment is applied to each wafer on the basis of the corrected developing time calculated for each wafer (step S507). Also, prepared as a comparative example was a sample in which all the wafers in a single lot were subjected to the developing treatment with the same developing time.

Figure 37:
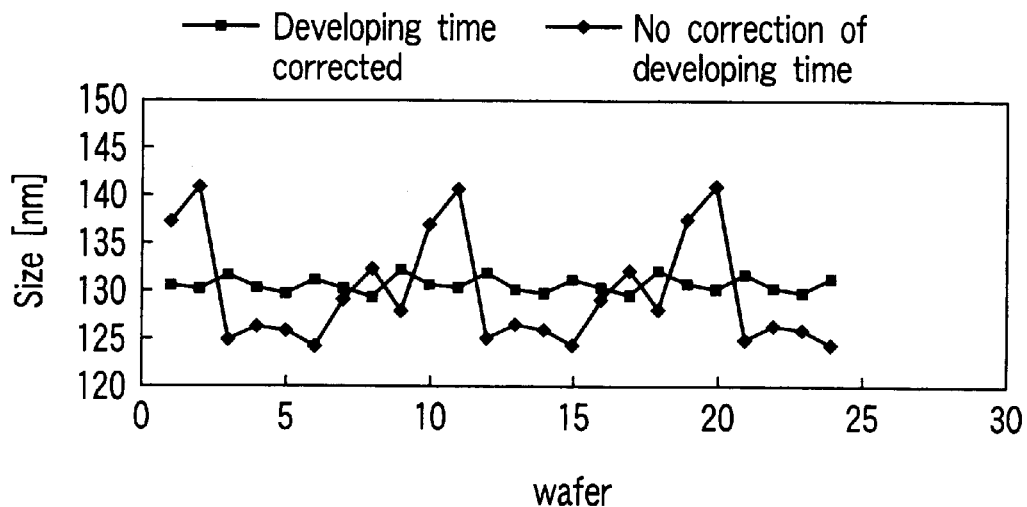
FIG. 37 shows the change in size of the resist pattern within the lot.

FIG. 37 shows the change in size of the resist pattern within the lot, which were subjected to the developing treatment by correcting the developing time, and the change in size of the resist pattern within the lot, which were subjected to the developing treatment without correcting the developing time. As apparent from FIG. 37, the change in size among the resist pattern of the lot is suppressed by correcting the developing time.

Incidentally, it is possible to select the developing conditions of recipes 1 to 5 in accordance with the difference ΔW between the finish size obtained from the effective exposure determined by formula (6) and the target size by preparing a table like Table 1 given below in place of obtaining the corrected developing time by using the formulas (6) and (8) given previously.

TABLE 1

| Difference ΔW of size | Developing conditions |
| --- | --- |
| +5.0—+7.5% | recipe 1 |
| +2.5—+5.0% | Recipe 2 |
| −2.5—+2.5% | Recipe 3 |
| −5.0—−2.5% | Recipe 4 |
| −7.5—−5.0% | Recipe 5 |

Third Embodiment B

The wafers in a single lot consisting of 5 wafers were consecutively subjected to an exposure treatment in accordance with steps S201 to S207 included in the flow chart shown in FIG. 29, followed by examining the change in the effective exposure for the resist film and the actual temperature in the step of heating the wafer in accordance with steps S208 to S210. Incidentally, the actual temperature was monitored by a sensor arranged on the hot plate.

Figure 38:
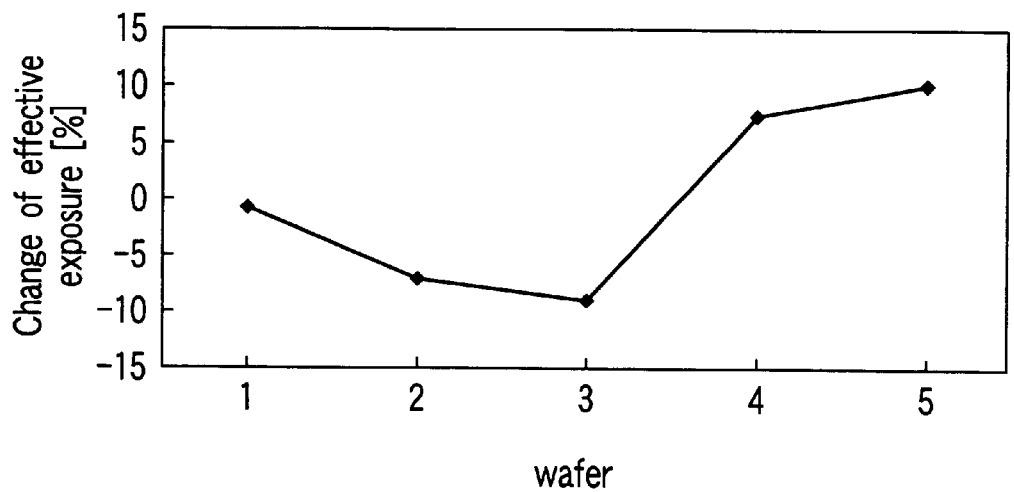
FIG. 38 is graph showing the distribution of changes in the effective exposure of each wafer within the lot according to the third embodiment B of the present invention.
Figure 39:
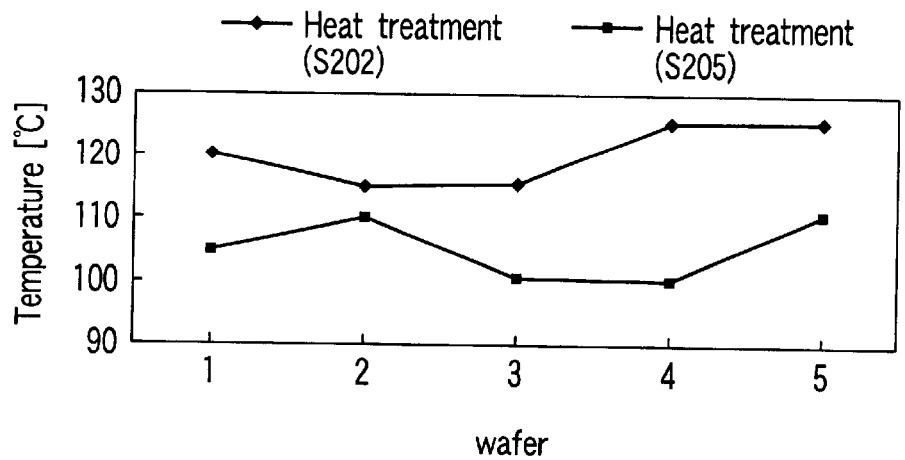
FIG. 39 is graph showing the actual temperature for each heating treatment of each wafer within the lot according to the third embodiment B of the present invention.

FIG. 38 shows the change in the effective exposure for each wafer, and FIG. 39 shows the actual temperature for each heating treatment. As shown in FIG. 39, the actual temperature in each of the heating treatments was widely deviated from the set value of 120° C. for the heat treatment before the exposure (step S202) and the set value of 105° C. for the heating after the exposure (step S205) so as to greatly affect the finish size (effective exposure).

A regression analysis was applied to the change in the effective exposure relative to the actual temperature in the heat treatments (steps S202 and S205) so as to obtain a multi regression formula given below. Incidentally, since it has been found that the change in the exposure is subject to the mutual function between the first heat treatment and the second heat treatment, the term directed to the mutual function is included in the multiple regression function given below:

$$P = -2.472 + 0.22 \times Q - 0.294 \times R + 0.003 \times Q \times R$$

Where P represents the estimated effective exposure, Q represents the actual temperature of the heat treatment (step S202), and R represents the actual temperature of the heat treatment (step S205).

A formula for calculating the corrected developing time was prepared by using the formula given above, as in the third embodiment A.

Figure 40:
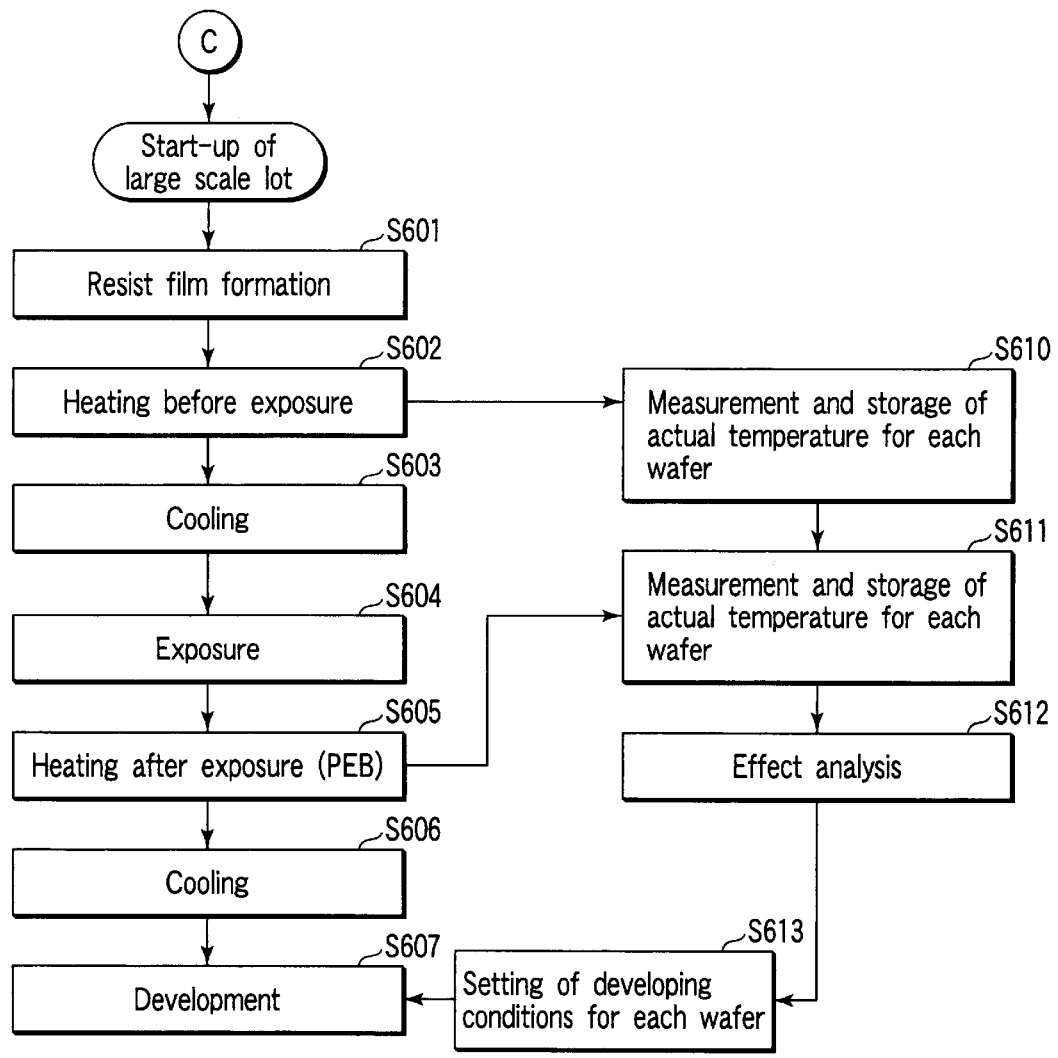
FIG. 40 is a flow chart showing a method for manufacturing a semiconductor device according to a third embodiment B of the present invention.

The exposure and developing treatments for the resist film for product lot are carried out in accordance with the flow chart shown in FIG. 40. FIG. 40 is a flow chart showing the manufacturing process of a semiconductor device according to the third embodiment B of the present invention. Incidentally, the series of the steps shown in FIG. 40 are carried out after the series of steps shown in FIG. 29.

In the exposure for product lot, the wafers of the lot consisting of 24 wafers were subjected to the exposure-developing treatment. During the treatment, the actual temperatures for the heat treatments(S202 and S205) were obtained on the real time basis so as to calculate the corrected developing time for each wafer. Then, a developing treatment was applied to each wafer on the basis of the corrected developing time thus calculated. Also, prepared as a comparative example was a sample in which all the wafers in a single lot were subjected to the developing treatment with the same developing time.

Figure 41:
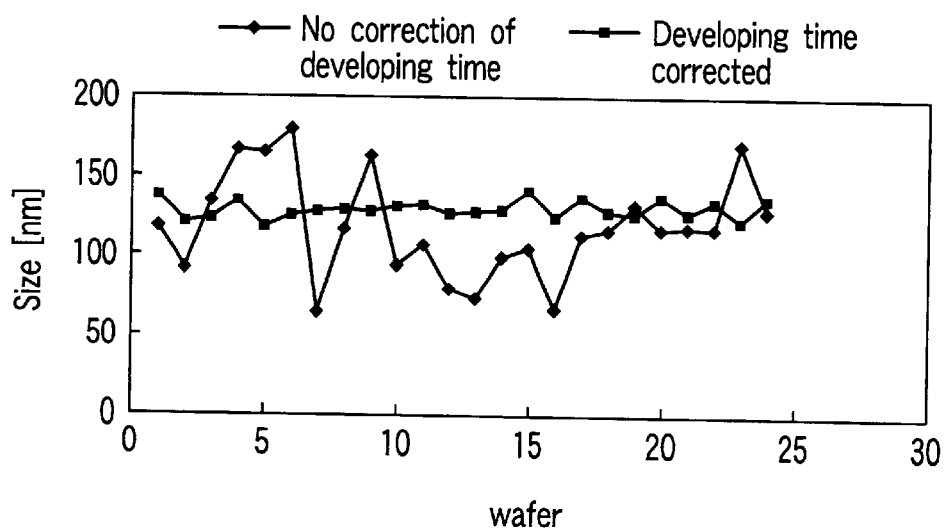
FIG. 41 shows the change in size of the resist pattern within the lot.

FIG. 41 shows the change in size of the resist pattern within the lot, which were subjected to the developing treatment by correcting the developing time, and the change in size of the resist pattern within the lot, which were subjected to the developing treatment without correcting the developing time. As apparent from FIG. 41, the change in size among the wafers of the lot is suppressed by correcting the developing time.

The experiment conducted this time covers the case where the change in the effective exposure time and the change in the focus are monitored after the developing treatment. Alternatively, it is also possible to perform the measurement in respect of the latent image after the heat treatment carried out after the exposure, with substantially the same effect.

Incidentally, it is possible to select the developing conditions of recipes 1 to 5 in accordance with the difference ΔW between the finish size obtained from the effective exposure determined by formula (6) and the target size by preparing a table like Table 2 given below in place of obtaining the corrected developing time by using the formulas (6) and (8) given previously.

TABLE 2

| Difference ΔW of size | Developing conditions |
| --- | --- |
| +5.0—+7.5% | recipe 1 |
| +2.5—+5.0% | Recipe 2 |
| −2.5—+2.5% | Recipe 3 |
| −5.0—−2.5% | Recipe 4 |
| −7.5—−5.0% | Recipe 5 |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device involving a method of controlling an apparatus for manufacturing a semiconductor device, said method of controlling an apparatus comprising setting the exposure and the focus position in forming a pattern by transferring a circuit pattern formed on a mask by an exposure apparatus onto a resist film formed on a wafer, the method of manufacturing the semiconductor device comprising:

coating each wafer of a first group of wafers with a resist film;

applying a first heat treatment to said resist film;

applying a first cooling treatment to the resist film subjected to said first heat treatment;

setting an exposure and a focus position at prescribed values and applying an exposure treatment to said resist film to which is applied a first cooling treatment by using a mask in which is arranged a monitor mark including at least one of an exposure monitor mark for detecting the effective exposure on said wafer and a focus monitor mark for detecting the effective focus on said wafer so as to form a latent image corresponding to said monitor mark in said resist film;

applying a second heat treatment to the resist film having the latent image formed therein;

applying a second cooling treatment to the resist film having said second heat treatment applied thereto;

applying a developing treatment to the resist film having said second cooling treatment applied thereto so as to form a monitor pattern corresponding to said latent image;

measuring the state of the latent image of said monitor mark or the state of said monitor pattern at least once any time after the exposure treatment, after the second heat treatment, during the second cooling treatment, after the second cooling treatment, during the developing treatment, or after the developing treatment;

obtaining at least one of the effective exposure and the focus position in the exposure treatment applied to said resist film based on the measured state of the latent image of the monitor mark or monitor pattern;

calculating at least one of the difference between the optimum exposure in performing an exposure by using said mask and said set value and the difference between the optimum focus position and the set value from at least one of the obtained effective exposure and focus position;

obtaining the correlations among the calculated change, the process conditions, and the residence time between the different treatments, for each of the treatments carried out between the coating of the resist film on said wafer and the developing treatment applied to said resist film;

extracting the treatment or the residence time between the different treatments having the largest of the obtained correlations; and changing at least one process condition for the treatments after the resist film coating step so as to permit the process condition of the extracted treatment or the residence time between the different treatments to be made constant among a second group of wafers for forming a pattern of the resist film on each of the second group of wafers.

2. The method of manufacturing a semiconductor device according to claim 1, wherein said exposure monitor mark includes a periodic pattern in which a transmitting portion and a light shielding portion are repeated at a period P represented by: $P/M \leq \lambda/(1+\sigma)NA$, where M represents the magnification of said mask, $\lambda$ represents the wavelength of the exposure light, NA represents the number of apertures on the emitting side of a projecting optical system of said exposure apparatus, and $\sigma$ represents the coherent factor of the illuminating system of said exposure device.

3. The method of manufacturing a semiconductor device according to claim 1, wherein:

a focus monitor mark, in which a length of a latent image of the focus monitor mark and a focus monitor pattern as said monitor pattern formed in said resist film are changed in accordance with the focus position, is formed in said mask as a focus monitor mark;

the relationship among a length of the latent image of said focus monitor mark or the focus monitor pattern, an effective exposure, and the focus position is obtained in advance; and the focus position is obtained from the relationship among an effective exposure obtained by measuring the state of a latent image of said exposure monitor mark or the exposure monitor pattern corresponding to said latent image, the length of the latent image of said focus monitor mark or the focus monitor pattern, and said relationship.

4. The method of manufacturing a semiconductor device according to claim 1, wherein:

two focus monitor marks, in which the length of two latent images of the two focus monitor marks and two focus monitor patterns corresponding to said latent images formed in the resist film are changed in accordance with the focus position, are formed in said mask such that said two focus monitor marks differ from each other in direction;

the relationship between the difference in length between the latent images of said two focus monitor marks or the two focus monitor patterns and the focus position is obtained in advance; and a focus position is obtained from the difference obtained by measuring the states of the latent images of said two focus monitor marks or the two focus monitor patterns and said relationship.

5. The method of manufacturing a semiconductor device according to claim 1, wherein:

the states of said exposure monitor pattern and said focus monitor pattern relative to the change in the effective exposure and the change in the deviation amount of the focus position on the resist film obtained by using said exposure monitor mark are measured in advance; and the difference between the optimum focus position and the focus position set in the exposure device is calculated on the basis of the result of the measurement performed in advance and the results of the measurement of the states of said exposure monitor pattern and said focus monitor pattern.

6. The method of manufacturing a semiconductor device according to claim 1, wherein:

the process conditions and the residence time between the different treatments are the focus position, the exposure, the heating condition for the first heat treatment, the heating condition for the second heat treatment, the developing condition for the developing treatment, the residence time between the completion of the exposure treatment and the start-up of the second heat treatment, the residence time between the completion of the second heat treatment and the start-up of the second cooling treatment, the residence time between the completion of the second cooling treatment and the start-up of the developing treatment, the residence time between the completion of the resist film coating and the start-up of the heat treatment, the residence time between the completion of the first heat treatment and the start-up of the first cooling treatment, and the residence time between the completion of the first cooling treatment and the start-up of the exposure.

7. A method of manufacturing a semiconductor device involving a method of controlling an apparatus for manufacturing a semiconductor device, said method of controlling an apparatus comprising setting the exposure and the focus position in forming a pattern by transferring a circuit pattern formed on a mask by an exposure apparatus onto a resist film formed on a wafer, the method of manufacturing a semiconductor device comprising:

coating each wafer of a first group of wafers with a resist film;

applying a first heat treatment to said resist film;

applying a first cooling treatment to the resist film subjected to said first heat treatment;

setting an exposure and a focus position at prescribed values and applying an exposure treatment to said resist film to which is applied a first cooling treatment by using a mask in which is arranged a monitor mark including at least one of an exposure monitor mark for detecting an effective exposure on said wafer and a focus monitor mark for detecting an effective focus on said wafer so as to form a latent image corresponding to said monitor mark in said resist film;

applying a second heat treatment to the resist film having the latent image formed therein;

applying a second cooling treatment to the resist film having said second heat treatment applied thereto;

applying a developing treatment to the resist film having said second cooling treatment applied thereto so as to form a monitor pattern corresponding to said latent image;

measuring the state of the latent image of said monitor mark or the state of said monitor pattern at least once any time after the exposure treatment, after the second heat treatment, during the second cooling treatment, after the second cooling treatment, during the developing treatment, or after the developing treatment;

obtaining at least one of the effective exposure and the focus position in the exposure treatment applied to said resist film based on the measured state of the latent image of the monitor mark or the monitor pattern;

calculating at least one of the difference between the optimum exposure in performing an exposure by using said mask and said set value and the difference between the optimum focus position and the set value from at least one of the obtained effective exposure and focus position;

obtaining the correlations among the calculated change, the process conditions, and the residence time between the different treatments, for each of the treatments carried out between the coating of the resist film on said wafer and the developing treatment applied to said resist film;

extracting the treatment or the residence time between the different treatments having the largest of the obtained correlation;

storing the process conditions for each wafer in respect of the process conditions of the extracted treatment and the residence time between the different treatments in applying a series of treatments ranging between the coating of the resist film and the developing treatment to the wafer included in the second wafer group; and controlling the developing conditions on the basis of the stored values.

8. The method of manufacturing a semiconductor device according to claim 7, wherein:

a formula for estimating the finish size is prepared from the process conditions of the extracted treatment or the residence time between the different treatments; and the developing conditions are controlled on the basis of the stored values and the prepared formula.

9. The method of manufacturing a semiconductor device according to claim 7, wherein the developing condition is selected from the developing conditions prepared in advance such that the estimated finish size is rendered equal to the target size.

10. The method of manufacturing a semiconductor device according to claim 7, wherein the residence time between the different treatments, said residence time having the highest correlation, is selected from the group consisting of the residence time between the completion of the first cooling treatment and the start-up of the exposure, the residence between the completion of the second heat treatment and the start-up of the second cooling time, and the residence time between the completion of the second cooling treatment and the start-up of the developing treatment.

11. The method of manufacturing a semiconductor device according to claim 7, wherein the process condition of the treatment having the largest correlation or the residence time between the different treatments are the process temperature for the first heating treatment and the process temperature for the second heating process.

12. The method of manufacturing a semiconductor device according to claim 7, wherein said exposure monitor mark includes a periodic pattern in which a transmitting portion and a light shielding portion are repeated at a period P represented by: $P/M \leq \lambda(1+\sigma)NA$, where M represents the magnification of said mask, $\lambda$ represents the wavelength of the exposure light, NA represents the number of apertures on the emitting side of a projecting optical system of said exposure apparatus, and $\sigma$ represents the coherent factor of the illuminating system of said exposure device.

13. The method of manufacturing a semiconductor device according to claim 7, wherein:

a focus monitor mark, in which a length of a latent image of the focus monitor mark and a focus monitor pattern as said monitor pattern formed in said resist film are changed in accordance with the focus position, is formed in said mask as a focus monitor mark;

the relationship among a length of the latent image of said focus monitor mark or the focus monitor pattern, an effective exposure, and the focus position is obtained in advance; and the focus position is obtained from the relationship by measuring the state of a latent image of said exposure monitor mark or the exposure monitor pattern corresponding to said latent image, the length of the latent image of said focus monitor mark, or the focus monitor pattern.

14. The method of manufacturing a semiconductor device according to claim 7, wherein:

two focus monitor marks, in which the length of two latent images of the two focus monitor marks and a focus monitor patterns corresponding to said latent images formed in a the resist film are changed in accordance with the focus position, are formed as a focus monitor mark in said mask such that said two marks differ from each other in direction;

the relationship between the difference in length between the latent images of said two focus monitor marks or the two focus monitor patterns and the focus position is obtained in advance; and a focus position is obtained from the difference obtained by measuring the states of the latent images of said two focus monitor marks or the two focus monitor patterns and said relationship.

15. A method of manufacturing a semiconductor device involving a method of controlling an apparatus for manufacturing a semiconductor device, said method comprising setting the exposure and the focus position in forming a pattern by transferring a circuit pattern formed on a mask by an exposure apparatus onto a resist film formed on wafers, comprising:

coating each wafer of a first group of wafers with a resist film;

applying a first heat treatment to said resist film;

applying a first cooling treatment to the resist film subjected to said first heat treatment;

setting an exposure and a focus position at prescribed values and applying an exposure treatment to said resist film to which is applied a first cooling treatment by using a mask in which is arranged a monitor mark including at least one of an exposure monitor mark for detecting the effective exposure on said wafer and a focus monitor mark for detecting the effective focus on said wafer so as to form a latent image corresponding to said monitor mark in said resist film;

applying a second heat treatment to the resist film having the latent image formed therein;

applying a second cooling treatment to the resist film having said second heat treatment applied thereto;

applying a developing treatment to the resist film having said second cooling treatment applied thereto so as to form a monitor pattern corresponding to said latent image;

measuring the state of the latent image of said monitor mark or the state of said monitor pattern at least once any time after the exposure treatment, after the second heat treatment, during the second cooling treatment, after the second cooling treatment, during the developing treatment, or after the developing treatment;

obtaining at least one of the effective exposure and the focus position in the exposure treatment applied to said resist film based on the measured state of the latent image of the monitor mark or monitor pattern;

calculating at least one of the difference between the optimum exposure in performing an exposure by using said mask and said set value and the difference between the optimum focus position and the set value from at least one of the obtained effective exposure and focus position;

obtaining the correlations among the calculated change, the process conditions, and the residence time between the different treatments, for each of the treatments carried out in the period between the coating of the resist film on said wafer and the developing treatment applied to said resist film;

extracting the treatment or the residence time between the different treatments having the largest of the obtained correlations; and obtaining the relationship between the process conditions of the extracted treatment or the residence time between the different treatments and at least one of the effective exposure and the focus position; and forming a pattern of the resist film on each wafer by storing the process conditions of the extracted treatment or the residence between different treatments for each wafer in applying a series of treatments ranging between the coating of the resist film and the exposure treatment to the wafers of the second wafer group, and by changing for each wafer at least one of the process conditions of the treatment other than the extracted treatment and the residence time between the different treatments based on the stored value for each wafer and the obtained relationship.

16. The method of manufacturing a semiconductor device according to claim 15, wherein said exposure monitor mark includes a periodic pattern in which a transmitting portion and a light shielding portion are repeated at a period P represented by: $P/M \leq \lambda/(1+\sigma)NA$, where M represents the magnification of said mask, $\lambda$ represents the wavelength of the exposure light, NA represents the number of apertures on the emitting side of a projecting optical system of said exposure apparatus, and $\sigma$ represents the coherent factor of the illuminating system of said exposure device.

17. The method of manufacturing a semiconductor device according to claim 15, wherein:

a focus monitor mark, in which a length of a latent image of the focus monitor mark and a focus monitor pattern as said monitor pattern formed in said resist film are changed in accordance with the focus position, is formed in said mask as a focus monitor mark;

the relationship among a length of the latent image of said focus monitor mark or the focus monitor pattern, an effective exposure, and the focus position is obtained in advance; and the focus position is obtained from the relationship among an effective exposure obtained by measuring the state of a latent image of said exposure monitor mark or the exposure monitor pattern corresponding to said latent image, the length of the latent image of said focus monitor mark or the focus monitor pattern, and said relationship.

18. The method of manufacturing a semiconductor device according to claim 15, wherein:

two focus monitor marks, in which the length of two latent images of the two focus monitor marks and a focus monitor patterns corresponding to said latent images formed in a the resist film are changed in accordance with the focus position, are formed as a focus monitor mark in said mask such that said two marks differ from each other in direction;

the relationship between the difference in length between the latent images of said two focus monitor marks or the two focus monitor patterns and the focus position is obtained in advance; and a focus position is obtained from the difference obtained by measuring the states of the latent images of said two focus monitor marks or the two focus monitor patterns and said relationship.

19. The method of manufacturing a semiconductor device according to claim 15, wherein:

the states of said exposure monitor pattern and said focus monitor pattern relative to the change in the effective exposure and the change in the deviation amount of the focus position on the resist film obtained by using said exposure monitor mark are measured in advance; and the difference between the optimum focus position and the focus position set in the exposure device is calculated on the basis of the result of the measurement performed in advance and the results of the measurement of the states of said exposure monitor pattern and said focus monitor pattern.

20. The method of manufacturing a semiconductor device according to claim 15, wherein:

the process conditions and the residence time between the different treatments are the focus position, the exposure, the heating condition for the first heat treatment, the heating condition for the second heat treatment, the developing condition for the developing treatment, the residence time between the completion of the exposure treatment and the start-up of the second heat treatment, the residence time between the completion of the second heat treatment and the start-up of the second cooling treatment, the residence time between the completion of the second cooling treatment and the start-up of the developing treatment, the residence time between the completion of the resist film coating and the start-up of the heat treatment, the residence time between the completion of the first heat treatment and the start-up of the first cooling treatment, and the residence time between the completion of the first cooling treatment and the start-up of the exposure.

* * * * *

UNITED STATES PATENT AND TRADEMARK OFFICE
CERTIFICATE OF CORRECTION

PATENT NO. : 6,667,139 B2
DATED : December 23, 2003
INVENTOR(S) : Fujisawa et al.

It is certified that error appears in the above-identified patent and that said Letters Patent is hereby corrected as shown below:

<u>Title page,</u>
Item [57], ABSTRACT,
Line 2, change "f a" to -- of a --.
Line 10, change "and the a value" to -- and the value --.

<u>Column 26,</u>
Line 20, change "P/M ≦ λ(1+σ)NA," to -- P/M ≦ λ/(1 + σ)NA, --.
Lines 47-48, change "and a focus" to -- and focus --.
Line 49, change "in a the" to -- in the --.

<u>Column 28,</u>
Lines 30-31, change "and a focus" to -- and focus --.
Line 32, change "in a the" to -- in the --.

Signed and Sealed this

Twenty-seventh Day of April, 2004

JON W. DUDAS
*Acting Director of the United States Patent and Trademark Office*